US007679048B1

(12) United States Patent
Aziz et al.

(10) Patent No.: US 7,679,048 B1
(45) Date of Patent: Mar. 16, 2010

(54) SYSTEMS AND METHODS FOR SELECTING MICROBOLOMETERS WITHIN MICROBOLOMETER FOCAL PLANE ARRAYS

(75) Inventors: Naseem Y. Aziz, Goleta, CA (US); Robert F. Cannata, Santa Barbara, CA (US)

(73) Assignee: Flir Systems, Inc., Wilsonville, OR (US)

( * ) Notice: Subject to any disclaimer, the term of this patent is extended or adjusted under 35 U.S.C. 154(b) by 78 days.

(21) Appl. No.: 12/105,929

(22) Filed: Apr. 18, 2008

(51) Int. Cl.
*G01D 18/00* (2006.01)

(52) U.S. Cl. .................................................. 250/252.1

(58) Field of Classification Search ............. 250/252.1, 250/338.1–338.5

See application file for complete search history.

(56) References Cited

U.S. PATENT DOCUMENTS

| | | | | |
|---|---|---|---|---|
| 4,853,538 | A * | 8/1989 | Jackson | 250/336.2 |
| 4,947,057 | A | 8/1990 | Czarnocki et al. | |
| 5,756,999 | A | 5/1998 | Parrish et al. | |
| 5,811,808 | A | 9/1998 | Cannata et al. | |
| 6,028,309 | A | 2/2000 | Parrish et al. | |
| 6,267,501 | B1 | 7/2001 | Wand et al. | |
| 6,300,616 | B1 | 10/2001 | Regensburger | |
| 6,359,460 | B1 | 3/2002 | Tanaka | |
| 6,441,372 | B1 | 8/2002 | Kawahara | |
| 6,515,285 | B1 | 2/2003 | Marshall et al. | |
| 7,034,301 | B2 | 4/2006 | Parrish et al. | |
| 2002/0040967 | A1 | 4/2002 | Oda | |
| 2003/0006374 | A1 | 1/2003 | McManus | |
| 2003/0122077 | A1 | 7/2003 | Kaufman et al. | |
| 2003/0146383 | A1 | 8/2003 | Knauth et al. | |
| 2003/0213910 | A1 | 11/2003 | Anderson et al. | |
| 2004/0200961 | A1 * | 10/2004 | Parrish et al. | 250/338.1 |
| 2005/0258367 | A1 | 11/2005 | Anderson et al. | |

FOREIGN PATENT DOCUMENTS

| | | |
|---|---|---|
| WO | WO 03/073054 | 9/2003 |

OTHER PUBLICATIONS

Parrish et al., "Low cost 160×128 uncooled infrared sensor array," 1998, Proceedings of SPIE, vol. 3360, pp. 111-119.*

Lent, Anne Fischer, "Infrared Detectors Image the Future," Photonics Spectra, Apr. 2003, vol. 37, Issue 4, pp. 78-80.

Backer, Brain S. et al., "Recent Improvements and Developments in Uncooled Systems at BAE Systems North America," Infrared Detectors and Focal Plane Arrays VII, Proceedings of SPIE, vol. 4721, pp. 83-90, 2002.

* cited by examiner

*Primary Examiner*—David P Porta
*Assistant Examiner*—Kiho Kim
(74) *Attorney, Agent, or Firm*—Haynes and Boone, LLP

(57) ABSTRACT

Systems and methods for microbolometer focal plane arrays provide for the selection of microbolometers within the microbolometer focal plane arrays. In accordance with an embodiment, a microbolometer focal plane array includes a plurality of microbolometers forming a microbolometer array, wherein contacts within the microbolometer array are shared by the microbolometers; a first plurality of switches adapted to provide a voltage to respective ones of the plurality of microbolometers; a second plurality of switches adapted to receive an output signal from respective ones of the plurality of microbolometers; and a third plurality of switches adapted to selectively short respective ones of the plurality of microbolometers in the microbolometer array.

27 Claims, 23 Drawing Sheets

SYSTEMS AND METHODS FOR SELECTING MICROBOLOMETERS WITHIN MICROBOLOMETER FOCAL PLANE ARRAYS

TECHNICAL FIELD

The present invention relates generally to focal plane arrays and, more particularly, to microbolometer focal plane arrays.

BACKGROUND

Microbolometer structures are generally fabricated on monolithic silicon substrates to form an array of microbolometers, with each microbolometer functioning as a pixel to produce a two-dimensional image. The change in resistance of each microbolometer is translated into a time-multiplexed electrical signal by circuitry known as read out integrated circuit (ROIC). The combination of ROIC and the microbolometer array are commonly known as a microbolometer focal plane array (FPA). Additional details regarding microbolometers may be found, for example, in U.S. Pat. Nos. 5,756,999 and 6,028,309, which are herein incorporated by reference in their entirety.

Each microbolometer in the array is generally formed with two separate contacts, which are not shared with adjacent microbolometers in the array. One contact is used to provide a reference voltage for the microbolometer while the other contact provides a signal path from the microbolometer to the ROIC. A drawback of having two contacts per microbolometer is that the contacts do not scale proportionally as semiconductor processing technologies transition to smaller dimensions. Consequently, as microbolometer dimensions are reduced, the contacts consume a greater percentage of the area designated for the microbolometer, which reduces the area available for the desired resistive portion of the microbolometer and impacts microbolometer performance.

For conventional approaches that implement shared contacts within a microbolometer array, there may be some susceptibility to column-to-column short defects. For example, if a column-to-column short defect occurs, the data from the microbolometers (microbolometer read outs) within the columns associated with the column-to-column short defect may exhibit high noise and crosstalk.

As a result, there is a need for improved techniques for implementing microbolometer focal plane arrays.

SUMMARY

Systems and methods are disclosed herein, in accordance with one or more embodiments, to provide microbolometer focal plane arrays implemented with shared contacts. For example in accordance with some embodiments, novel unit cells and readout timing techniques are disclosed, which may reduce sensitivity to high noise and/or crosstalk defects (e.g., a column-to-column short defect) within the microbolometer focal plane array. As a specific example in accordance with an embodiment, additional switches may be included within the unit cell and specific read out timing techniques may be applied, which may include the use of the previously read out microbolometer to isolate the microbolometer being currently read out from the defect (e.g., to attenuate defect induced noise and/or crosstalk that may exist due to the defect).

More specifically in accordance with an embodiment, a circuit includes a plurality of microbolometers forming a microbolometer array, wherein contacts within the microbolometer array are shared among the microbolometers; means for selecting from among the microbolometers in the microbolometer array and providing a corresponding output signal; and means for selectively shorting one or more of the microbolometers in the microbolometer array.

In accordance with another embodiment, a method of providing calibrated output signals, from a microbolometer focal plane array having shared contacts, includes selecting at least one row of the microbolometer focal plane array to provide corresponding output signals from microbolometers in the row; and selectively shorting one or more of the microbolometers in the microbolometer focal plane array that are not providing corresponding output signals.

In accordance with another embodiment, a microbolometer focal plane array includes a plurality of microbolometers forming a microbolometer array, wherein contacts within the microbolometer array are shared by the microbolometers; a first plurality of switches adapted to provide a reference signal to respective ones of the plurality of microbolometers; a second plurality of switches adapted to receive an output signal from respective ones of the plurality of microbolometers; and a third plurality of switches for selectively shorting one or more of the microbolometers in the microbolometer array.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
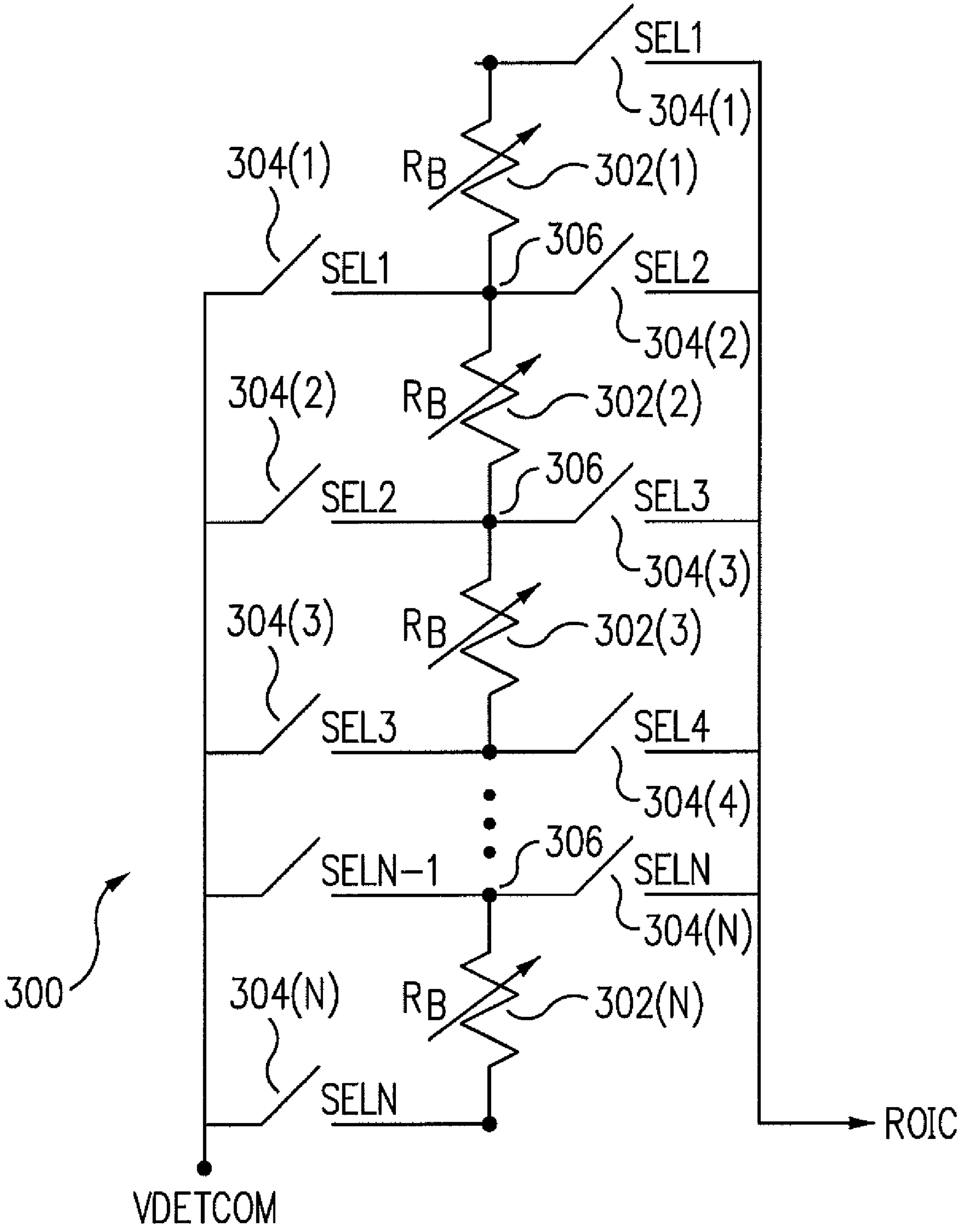
FIG. 1*a* shows a circuit diagram illustrating a microbolometer array and selection circuitry.

FIG. 1*a* shows a circuit 300 illustrating a microbolometer array and selection circuitry in accordance with an embodiment of the present invention. Circuit 300 includes microbolometers 302 and switches 304. In various implementations, microbolometers 302 (which are separately referenced as microbolometers 302(1) through 302(N), where N represents any desired number of microbolometers in a column) form at least a portion of an exemplary microbolometer array of at least one column of N rows, with adjacent (e.g., column neighbors within a column) microbolometers 302 sharing a contact 306. The number of columns and rows of the microbolometer array may vary, depending for example on the desired application, with circuit 300 replicated to form the desired number of additional columns. It should also be understood that reference to a column or a row may include a partial column or a partial row and that the column and row terminology may be interchangeable, depending upon the application.

Figure 2A:
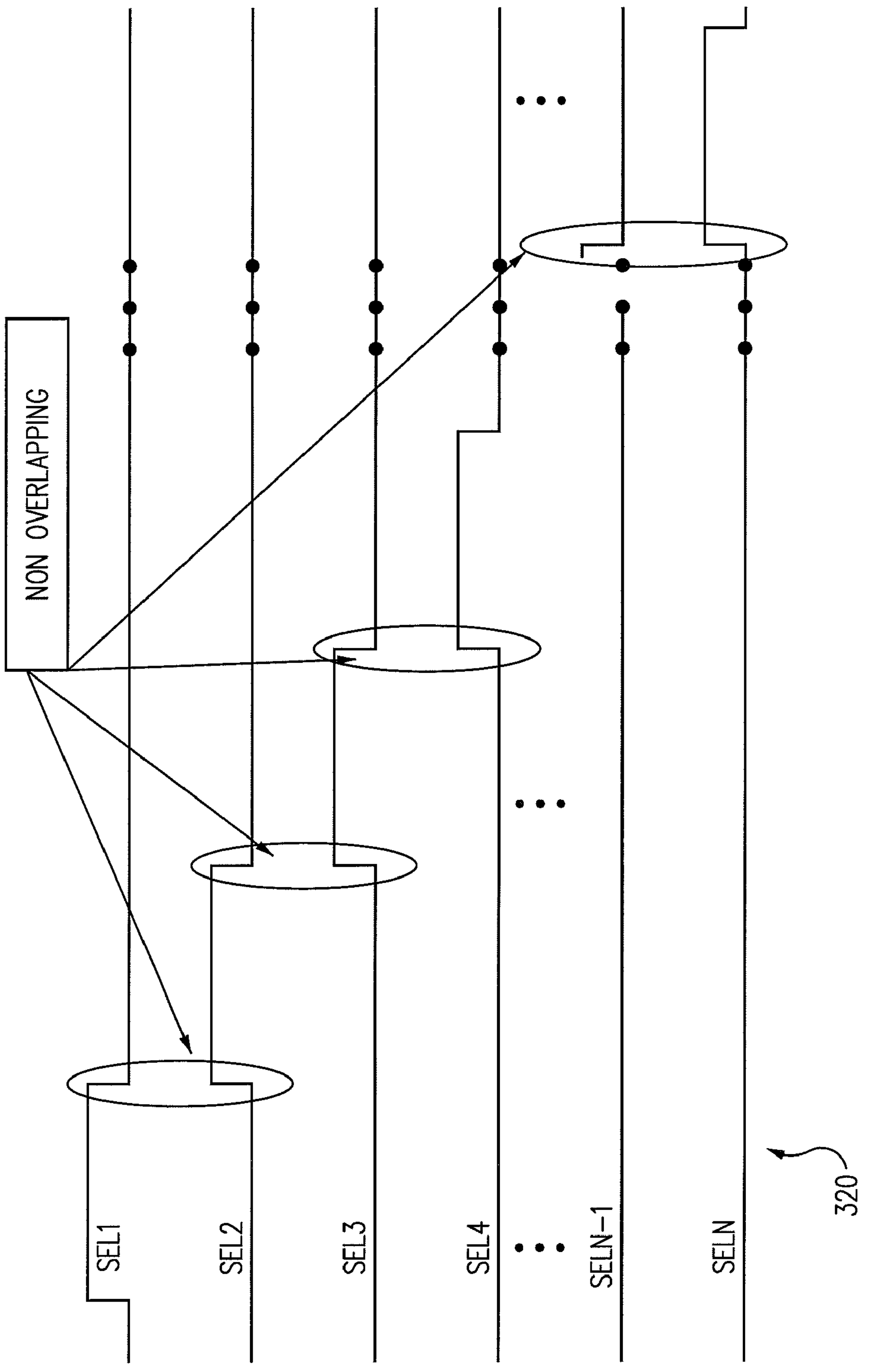
FIG. 2*a* shows a timing diagram for the selection circuitry of FIG. 1*a*.

Switches 304 are employed to select the desired row within the microbolometer array. For example, FIG. 2*a* shows an exemplary timing diagram 320 for the selection circuitry of FIG. 1*a* (circuit 300). Control signals (labeled SEL1 through SELN) are used to control corresponding switches 304 (e.g., transistors within the ROIC) to select the desired microbolometer row. For example, if the control signal SEL1 is asserted, switches 304(1) are closed and microbolometer 302 (1) receives a reference voltage (labeled VDETCOM and also referred to as Vbias, with its value set to, for example, ground or a desired voltage value) and provides a signal to associated or additional circuitry of the ROIC. In a similar fashion, microbolometers 302(2) through 302(N) may be selected, for example, row by row in a sequential fashion as shown in FIG. 2*a*.

As shown in FIG. 1*a*, microbolometers 302 within circuit 300 share a contact (contact 306) with an adjacent microbolometer 302 within the column. By sharing contacts, the number of contacts required for the microbolometer array is reduced and, consequently, the amount of area required for the contacts is reduced. However, this may affect the performance of the microbolometer array and hamper the ROIC's ability to capture data from the microbolometer array. For example, additional parasitic capacitances, defects (e.g., a column-to-column short defect), capacitive loading, and switch resistance may significantly degrade the array's performance. Furthermore, additional factors or non-uniformities may contribute to the performance degradation, especially if temperature variations occur, such as for example temperature coefficient of resistance (TCR), heat capacity, thermal conductivity of each microbolometer 302, and self heating. In accordance with one or more embodiments, techniques that may minimize one or more of these performance degradations are described in further detail herein.

Figure 1B:
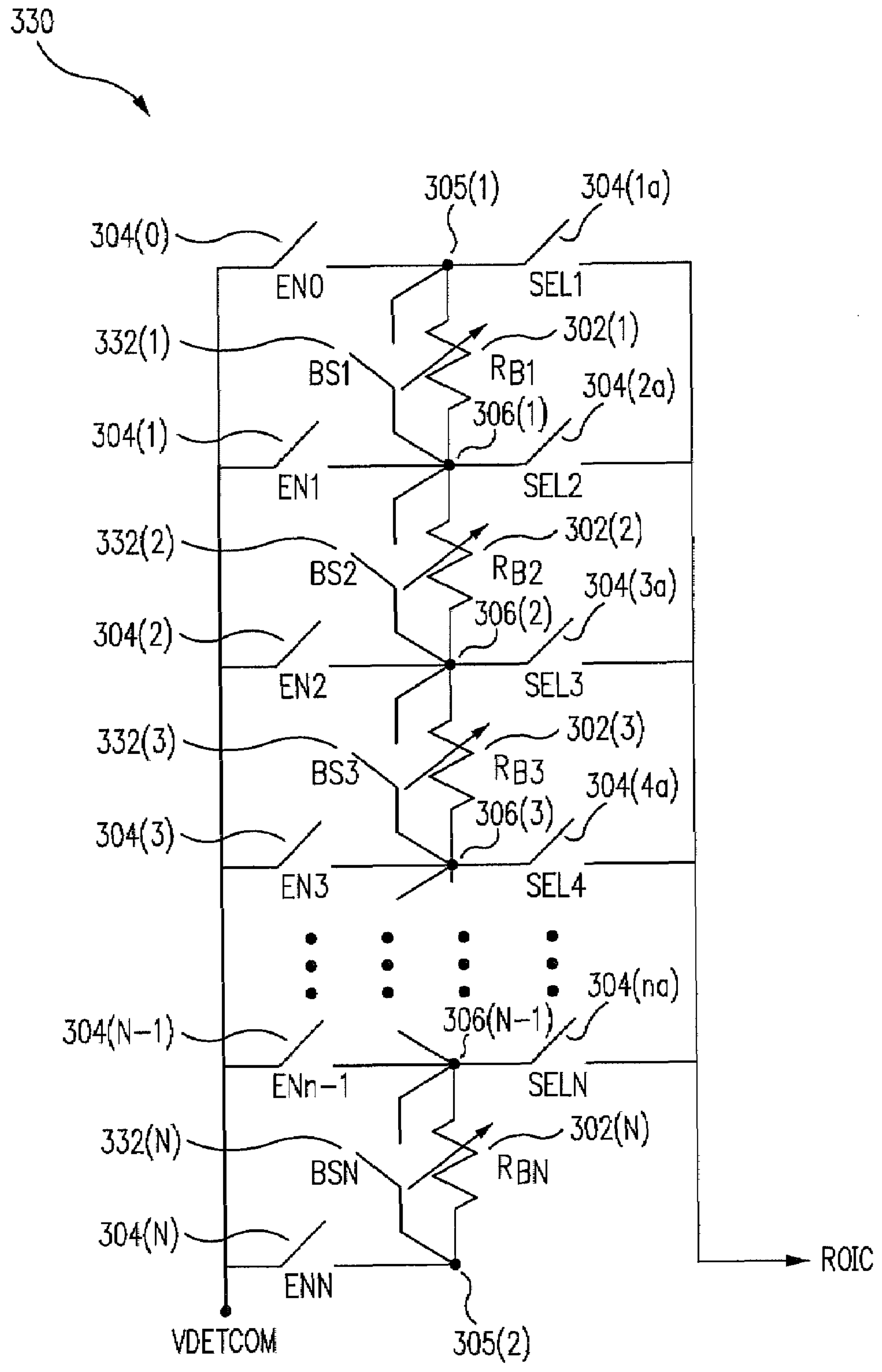
FIGS. 1*b*-1*d* show circuit diagrams illustrating microbolometer array and selection circuitry in accordance with embodiments of the present invention.

FIG. 1*b* shows a circuit 330 illustrating a microbolometer array and selection circuitry in accordance with an embodiment of the present invention. Circuit 330 is similar to circuit 300 (FIG. 1*a*), but circuit 330 further includes switches 332 that are in parallel with respective microbolometers 302. Control signals (labeled BS1 through BSN) are used to control corresponding switches 332 (e.g., microbolometer or bolometer short (BS) switches) to short respective microbolometers 302. Similarly, control signals (labeled SEL1 through SELN) and control signals (labeled EN0 through ENN) are used to control corresponding switches 304, as shown.

In accordance with an embodiment, switches 332 may be used to isolate their respective microbolometers 302, which may reduce parasitic capacitances or resolve performance issues. For example, by incorporating switch 332 within the unit cell and by application of specific timing (e.g., as discussed in reference to FIG. 2*b*), a reduced sensitivity to defects (e.g., a column-to-column short defect) may be provided, which may result in less noise, crosstalk, and/or reduced parasitic capacitance within the microbolometer focal plane array. As a specific example in accordance with an embodiment, referring briefly to FIG. 1*d*, specific switch timing may be provided to use the previously read out microbolometer to isolate the defect from the microbolometer currently being read out. In FIG. 1*d*, a column-to-column microbolometer (e.g., bolometer) short defect is illustrated along with the technique, by use of switches 332 and certain timing, to isolate the microbolometer 302 being currently read out by using the previously read out microbolometer, as discussed further herein.

Figure 2B:
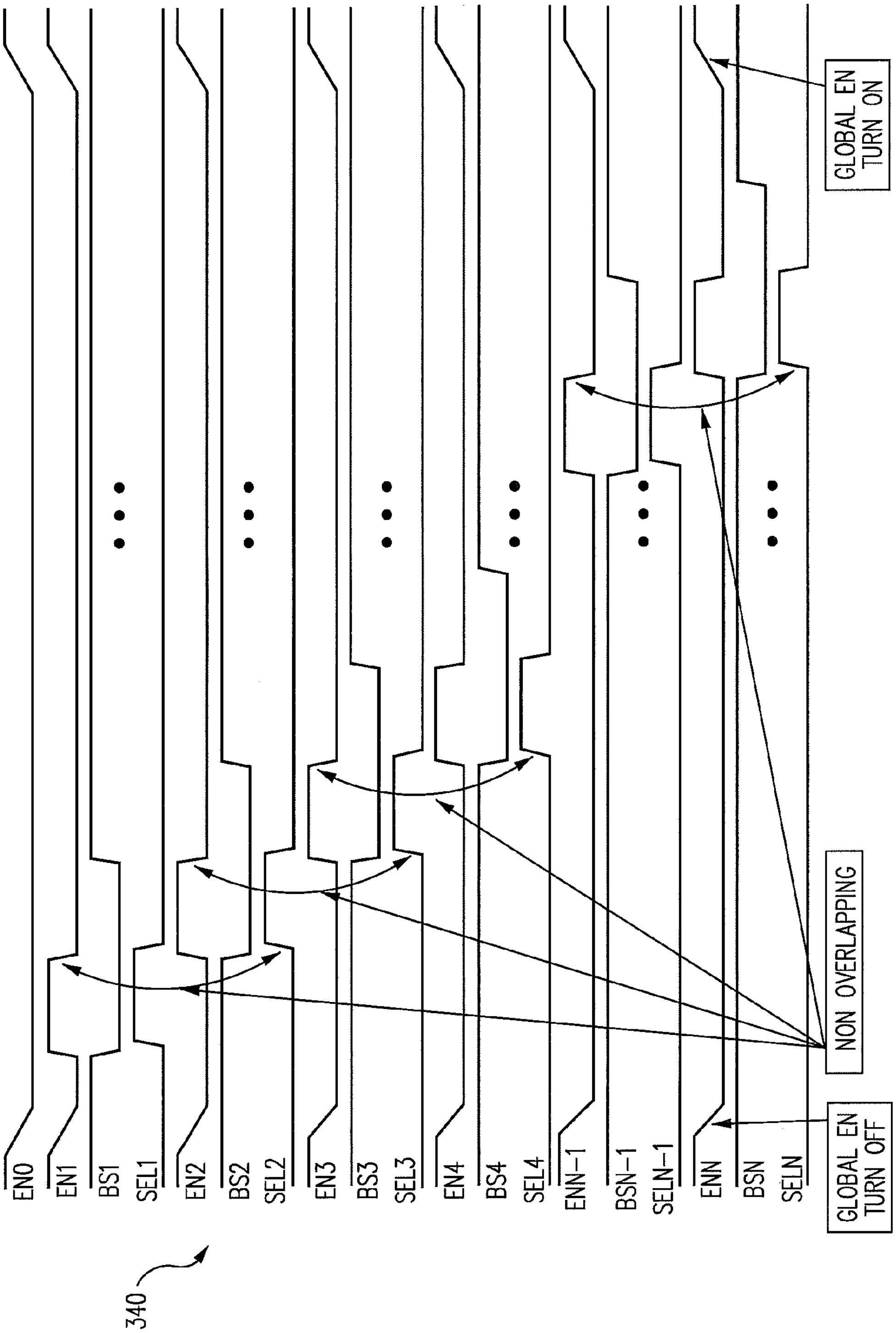
FIGS. 2*b* and 2*c* show timing diagrams for the selection circuitry of FIG. 1*b* and FIG. 1*c*, respectively, in accordance with embodiments of the present invention.

For example, FIG. 2*b* shows an exemplary timing diagram 340 for the selection circuitry of FIG. 1*b* (circuit 330). Control signals (labeled EN0 through ENN and SEL1 through SELN) are used to control corresponding switches 304 to select the desired microbolometer row, while control signals (labeled BS1 through BSN) are used to control corresponding switches 332, as illustrated in FIG. 1*b*.

In reference to FIGS. 1*b* and 2*b*, initially (to initialize) the control signals EN0 through ENN are asserted to close associated switches 304(0) through 304(N) and apply the reference voltage (VDETCOM) to microbolometers 302(1) through 302(N), while the control signals BS1 through BSN are asserted to close associated switches 332(1) through 332 (N). The control signals EN0 through ENN are then deasserted to open associated switches 304(0) through 304(N), with the control signal EN1 then asserted to close associated switch 304(1) and control signal BS1 deasserted to open associated switch 332(1). The control signal SEL1 is then asserted to close associated switch 304(1*a*) and read out microbolometer 302(1), with microbolometer 302(1) providing a signal to associated or additional circuitry of the ROIC (e.g., current flowing through switch 304(1*a*), microbolometer 302(1), and switch 304(1)).

The control signals EN1 and BS2 are then deasserted to open switch 304(1) and 332(2), respectively, to remove the reference voltage from microbolometer 302(1) and to remove the short across microbolometer 302(2). The control signal EN2 is then asserted to close associated switch 304(2). In accordance with an embodiment, a non-overlap time between the deassertion of the control signal EN1 and the eventual assertion of the control signal SEL2 results in a brief time when both microbolometers 302(1) and 302(2) are enabled (e.g., current flowing through switch 304(1*a*), associated with the control signal SEL1, microbolometers 302(1) and 302(2), and through switch 304(2) associated with the control signal EN2).

The control signal SEL1 is then deasserted to open associated switch 304(1*a*) and the control signal SEL2 is then asserted to close associated switch 304(2*a*), with microbolometer 302(2) read out (e.g., current flowing through switch 304(2*a*), microbolometer 302(2), and switch 304(2)) and providing a signal to associated or additional circuitry of the ROIC. Microbolometer 302(1), with switch 332(1) open, functions to isolate microbolometer 302(2) from a potential short (e.g., a column-to-column defect) at a node 305(1).

The control signals EN2 and BS3 are then deasserted to open associated switches 304(2) and 332(3), respectively, and the control signals EN3 and BS1 are asserted to close associated switches 304(3) and 332(1), respectively. In accordance with an embodiment, a non-overlap time between the deassertion of the control signal EN2 and the eventual assertion of the control signal SEL3 results in a brief time when both microbolometers 302(2) and 302(3) are enabled (e.g., current flowing through switch 304(2*a*), associated with the control signal SEL2, microbolometers 302(2) and 302(3), and through switch 304(3) associated with the control signal EN3).

The control signal SEL2 is then deasserted to open associated switch 304(2*a*) and the control signal SEL3 is then asserted to close associated switch 304(3*a*), with microbolometer 302(3) read out (e.g., current flowing through switch 304(3*a*), microbolometer 302(3), and switch 304(3)) and providing a signal to associated or additional circuitry of the ROIC. Microbolometer 302(2), with switch 332(2) open, functions to isolate microbolometer 302(3) from a potential short (e.g., a column-to-column defect) at node 305(1) and/or at contact 306(1).

In a similar fashion, microbolometers 302(4) through 302 (N) may be selected, for example, row by row in a sequential fashion as shown in FIG. 2*b*. After sampling microbolometers 302(1) through microbolometers 302(N), the control signals EN0 through ENN are all reasserted, while the control signals SEL1 through SELN are in a deasserted state and the control signals BS1 through BSN are in an asserted state, and thus timing diagram 340 may be repeated. By closing the select switches (e.g., switches 304 and 332) in this manner, the detrimental parasitic resistance and capacitance characteristics may be minimized and potential defects may be isolated, thus providing improved microbolometer array performance.

Figure 1C:
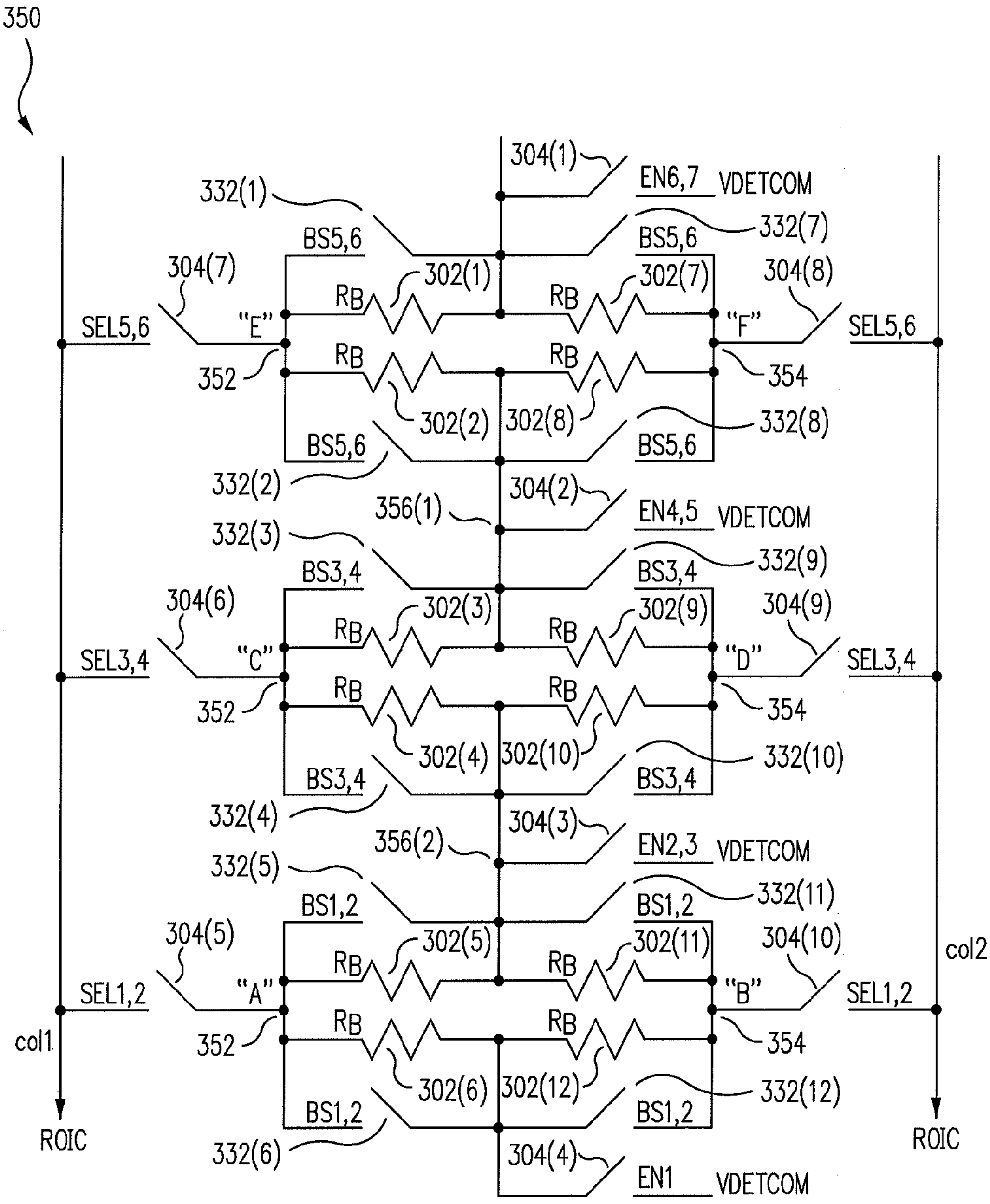
Figure 1D:
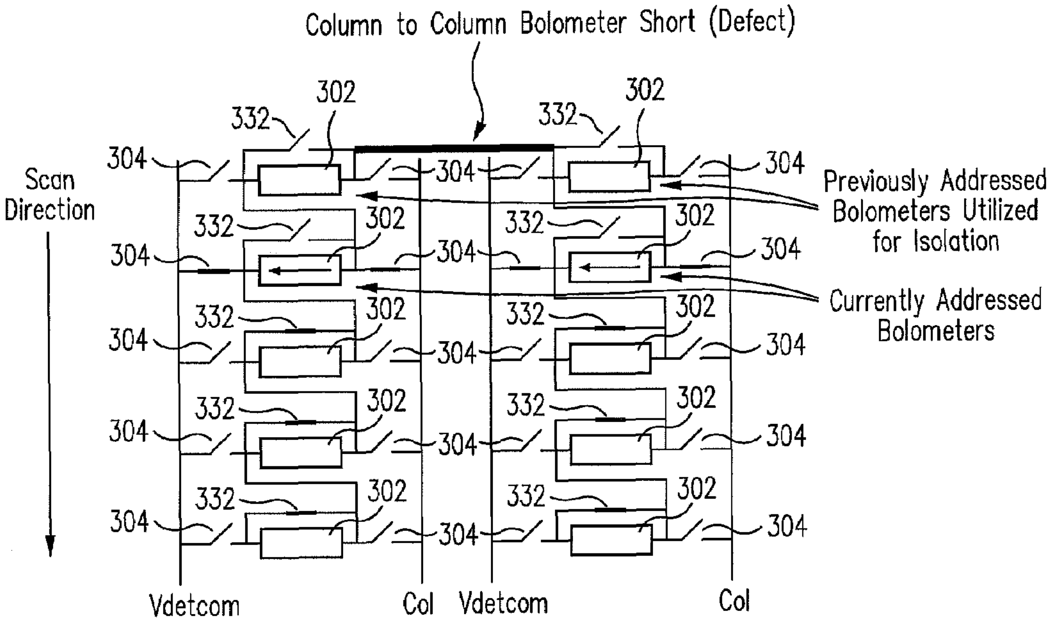

FIG. 1*c* shows a circuit 350 illustrating a microbolometer array and selection circuitry in accordance with an embodiment of the present invention. Circuit 350 includes microbolometers 302, switches 304, and switches 332. Microbolometers 302(1) through 302(6) form one column of microbolometers 302, while microbolometers 302(7) through 302(12) form another column of microbolometers 302 in the microbolometer array. Switches 332(1) through 332(6) are in parallel with microbolometers 302(1) through 302(6), respectively, while switches 332(7) through 332(12) are in parallel with microbolometers 302(7) through 302(12), respectively. It should be understood, however, that circuit 350 may include any number of microbolometers 302 to form the desired number of rows and that circuit 350 may be replicated to form the desired number of additional columns for the microbolometer array.

As discussed previously in reference to switches 332 of FIG. 1*b*, switches 332 of FIG. 1*c* in accordance with an embodiment may be used to isolate their respective microbolometers 302. Thus, switches 332 along with the application of specific timing (e.g., as discussed in reference to FIG. 2*c*) may provide for a reduced sensitivity to defects (e.g., a column-to-column short defect), which may result in less noise, crosstalk, and/or reduced parasitic capacitance within the microbolometer focal plane array.

Microbolometers 302 within circuit 350 share contacts within a column, such as for example contacts 352 for a first column and contacts 354 for a second column Microbolometers 302 within circuit 350 also share contacts between the first and second column, such as for example contacts 356, with microbolometers 302(2), 302(3), 302(8), and 302(9) sharing contact 356(1) and microbolometers 302(4), 302(5), 302(10), and 302(11) sharing contact 356(2).

Switches 304 are employed to select the desired row within the microbolometer array, while switches 332 may be used in accordance with an embodiment to provide further isolation from defects (e.g., column-to-column short defects). Furthermore for example, switches 332 may be used to control the number of isolation microbolometers 302 in series with potential parasitic capacitances (e.g., a string of microbolometers 332 along with parasitic capacitances in each unit cell may result in an undesirably long circuit time constant).

Figure 2C:
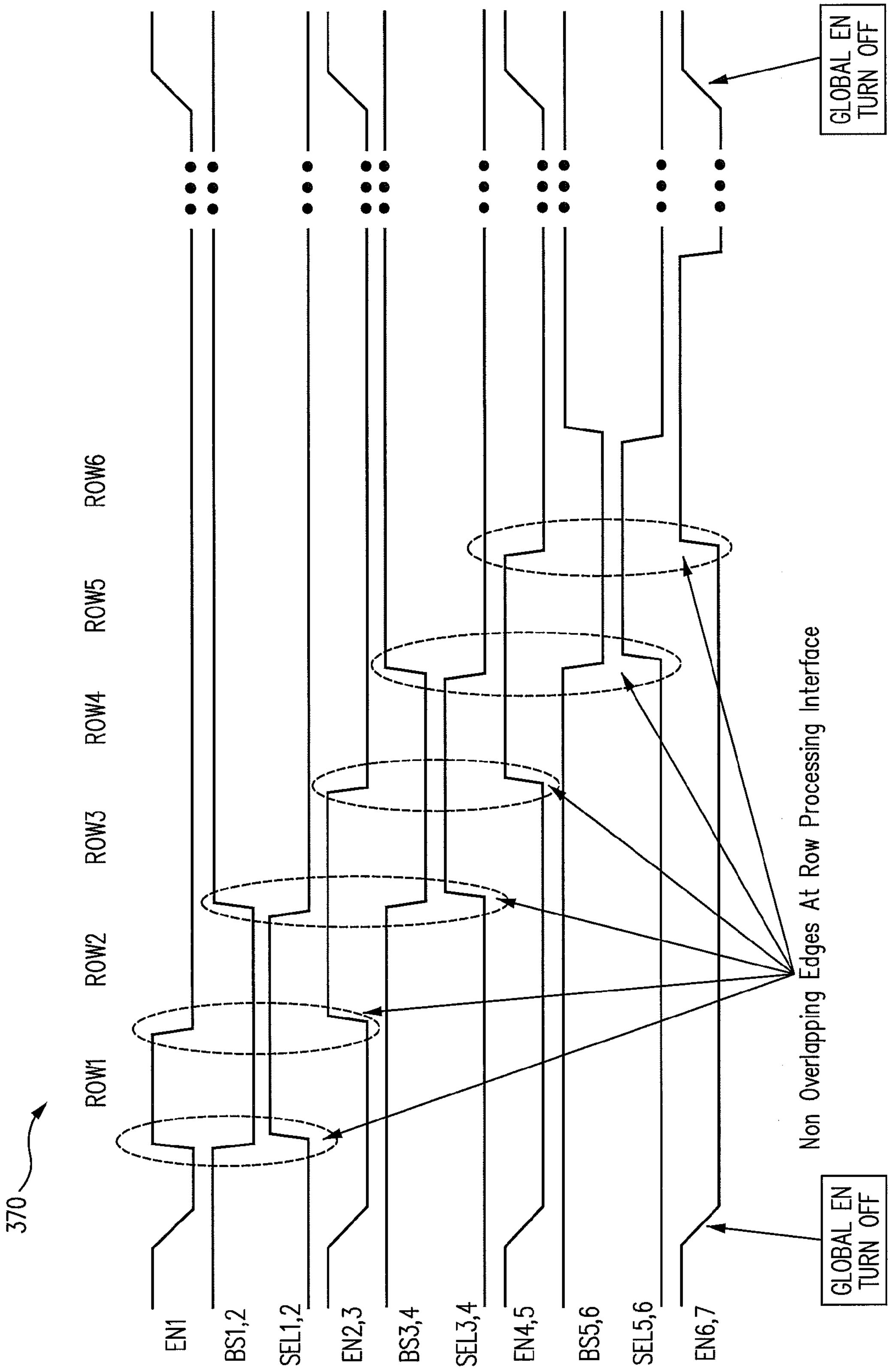

For example, FIG. 2*c* shows an exemplary timing diagram 370 for the selection circuitry of FIG. 1*c* (circuit 350). Control signals (labeled SEL1,2; EN1; EN2,3; SEL3,4; EN4,5; SEL5,6; and EN 6,7) are used to control corresponding switches 304 to select the desired microbolometer row, while control signals (labeled BS1,2; BS3,4; and BS5,6) are used to control corresponding switches 332, as illustrated in FIG. 1*c*. For example in accordance with an embodiment, control signals SEL1,2; SEL3,4; and SEL5,6 control the row selection switch for rows 1 and 2; rows 3 and 4; and rows 5 and 6, respectively, while control signals EN1, EN2,3, and EN4,5 control the row common enable switch for row 1, rows 2 and 3, and rows 4 and 5, respectively. Furthermore for example in accordance with an embodiment, control signals BS1,2; BS3, 4; and BS5,6 control the microbolometer short enable switch for rows 1 and 2, rows 3 and 4, and rows 5 and 6, respectively. Thus, the control signals in accordance with an embodiment may be generalized as control signal SELn,n+1 controls the row selection switch for rows n and n+1, control signal ENn, n+1 controls the row common enable switch for rows n and n+1, and control signal BSn,n+1 controls the microbolometer short enable switch for rows n and n+1.

In reference to FIGS. 1*c* and 2*c*, initially (to initialize) the control signals EN1 through EN6,7 are asserted to close associated switches 304(1) through 304(4) and apply the reference voltage (VDETCOM) to microbolometers 302(1) through 302(12), while the control signals BS1,2 through BS5,6 are asserted to close associated switches 332(1) through 332(12). The control signals EN2,3 through EN6,7 are then deasserted to open associated switches 304(1) through 304(3), leaving control signal EN1 asserted such that associated switch 304(4) remains closed, and control signals BS1,2 is deasserted to open associated switches 332(5), 332 (6), 332(11), and 332(12). The control signal SEL1,2 is then asserted to close associated switches 304(5) and 304(10) and read out microbolometers 302(6) and 302(12) (e.g., row 1) to provide signals to associated or additional circuitry of the ROIC (e.g., current flowing through switch 304(5), microbolometer 302(6), and switch 304(4) to read out microbolometer 302(6), and current flowing through switch 304(10), microbolometer 302(12), and switch 304(4) to read out microbolometer 302(12)). Thus, a node 352 (labeled "A") and a node 354 (labeled "B") are isolated from each other by the resistance value sum of microbolometers 302(5) and 302(11).

The control signals EN1 is then deasserted to open associated switch 304(4) prior to the control signal EN2,3 being asserted to close associated switch 304(3) (e.g., non-overlapping time during which current can flow between columns). Microbolometers 302(5) and 302(11) (e.g., row 2) are then read out to provide signals to associated or additional circuitry of the ROIC (e.g., current flowing through switch 304 (5), microbolometer 302(5), and switch 304(3) to read out microbolometer 302(5), and current flowing through switch 304(10), microbolometer 302(11), and switch 304(3) to read out microbolometer 302(11)). Thus, node 352 (labeled "A") and node 354 (labeled "B") are isolated from each other by the resistance value sum of microbolometers 302(6) and 302 (12).

The control signal SEL1,2 is then deasserted to open switches 304(5) and 304(10) prior to the control signal BS3,4 being deasserted and the control signal BS1,2 being asserted (e.g., non-overlapping time between the control signals SEL1,2 and BS1,2 and BS3,4 transitions). The control signal SEL3,4 is then asserted to read out microbolometers 302(4) and 302(10) (e.g., row 3) to provide signals to associated or additional circuitry of the ROIC (e.g., current flowing through switch 304(6), microbolometer 302(4), and switch 304(3) to read out microbolometer 302(4), and current flowing through switch 304(9), microbolometer 302(10), and switch 304(3) to read out microbolometer 302(10)). Thus, a node 352 (labeled "C") and a node 354 (labeled "D") are isolated from each other by the resistance value sum of microbolometers 302(3) and 302(9).

The control signal EN2,3 is then deasserted to open associated switch 304(3) prior to the control signal EN4,5 being asserted to close associated switch 304(2) (e.g., non-overlapping time between the control signals EN2,3 and EN4,5 transitions, with current flow possible between columns during the non-overlapping time period). Microbolometers 302(3) and 302(9) (e.g., row 4) are then read out to provide signals to associated or additional circuitry of the ROIC (e.g., current flowing through switch 304(6), microbolometer 302(3), and switch 304(2) to read out microbolometer 302(3), and current flowing through switch 304(9), microbolometer 302(9), and switch 304(2) to read out microbolometer 302(9)). Thus, node 352 (labeled "C") and node 354 (labeled "D") are isolated from each other by the resistance value sum of microbolometers 302(4) and 302(10).

The control signal SEL3,4 is then deasserted to open switches 304(6) and 304(9) prior to the control signal BS5,6 being deasserted and the control signal BS3,4 being asserted (e.g., non-overlapping time between the control signals SEL3,4 and BS3,4 and BS5,6 transitions). The control signal SEL5,6 is then asserted to read out microbolometers 302(2) and 302(8) (e.g., row 5) to provide signals to associated or additional circuitry of the ROIC (e.g., current flowing through switch 304(7), microbolometer 302(2), and switch 304(2) to read out microbolometer 302(2), and current flowing through switch 304(8), microbolometer 302(8), and switch 304(2) to read out microbolometer 302(8)). Thus, a node 352 (labeled "E") and a node 354 (labeled "F") are isolated from each other by the resistance value sum of microbolometers 302(1) and 302(7).

The control signal EN4,5 is then deasserted to open associated switch 304(2) prior to the control signal EN6,7 being asserted to close associated switch 304(1) (e.g., non-overlapping time between the control signals EN4,5 and EN6,7 transitions, with current flow possible between columns during the non-overlapping time period). Microbolometers 302(1) and 302(7) (e.g., row 6) are then read out to provide signals to associated or additional circuitry of the ROIC (e.g., current flowing through switch 304(7), microbolometer 302(1), and switch 304(1) to read out microbolometer 302(1), and current flowing through switch 304(8), microbolometer 302(7), and switch 304(1) to read out microbolometer 302(7)). Thus, node 352 (labeled "E") and node 354 (labeled "F") are isolated from each other by the resistance value sum of microbolometers 302(2) and 302(8).

In general in accordance with an embodiment of the present invention and in reference to FIGS. 1*c* and 2*c*, the microbolometers rows may be read out as follows. To process row 1, the control signals SEL1,2 and EN1 associated switches are closed, while the control signal BS1,2 associated switches are open. At a row1 to row 2 interface, the control signal EN1 associated switch is opened, then control signal EN2,3 closes associated switches so that control signals EN1 and EN2,3 do not overlap. To process row 2, the control signals SEL1,2 and EN2,3 associated switches are closed, while the control signal BS1,2 associated switches are open. At a row 2 to a row 3 interface, the control signal SEL1,2 associated switches are opened, then the control signals BS1,2 and BS3,4 switches change state (BS1,2 associated switches closed, BS3,4 associated switches opened), then the control signal SEL3,4 associated switches are closed so that the control signals SEL1,2, SEL3,4, and BS1,2 (and BS3,4) do not overlap.

To process row 3, the control signals SEL3,4 and EN2,3 associated switches are both closed, while the control signal BS3,4 associated switches are open. At a row 3 to a row 4 interface, the control signal EN2,3 associated switch is opened, then the control signal EN4,5 associated switch is closed so that the control signals EN2,3 and EN4,5 do not overlap. To process row 4, the control signals SEL3,4 and EN4,5 associated switches are closed, while the control signal BS3,4 associated switches are open. At a row 4 to a row 5 interface, the control signal SEL3,4 associated switches are opened, then the control signals BS3,4 and BS5,6 switches change state (BS3,4 associated switches closed, BS5,6 associated switches opened), then the control signal SEL5,6 associated switches are closed so that the control signals SEL3,4, SEL5,6, and BS3,4 (and BS5,6) do not overlap. Thus for this embodiment, the timing sequences may be continued until all rows have been processed. Note for this example implementation, an odd-to-even row interface results in non-overlapping transitions for the control signals EN, while for an even-to-odd row interface results in no overlapping transitions for the control signals SEL.

Figure 3:
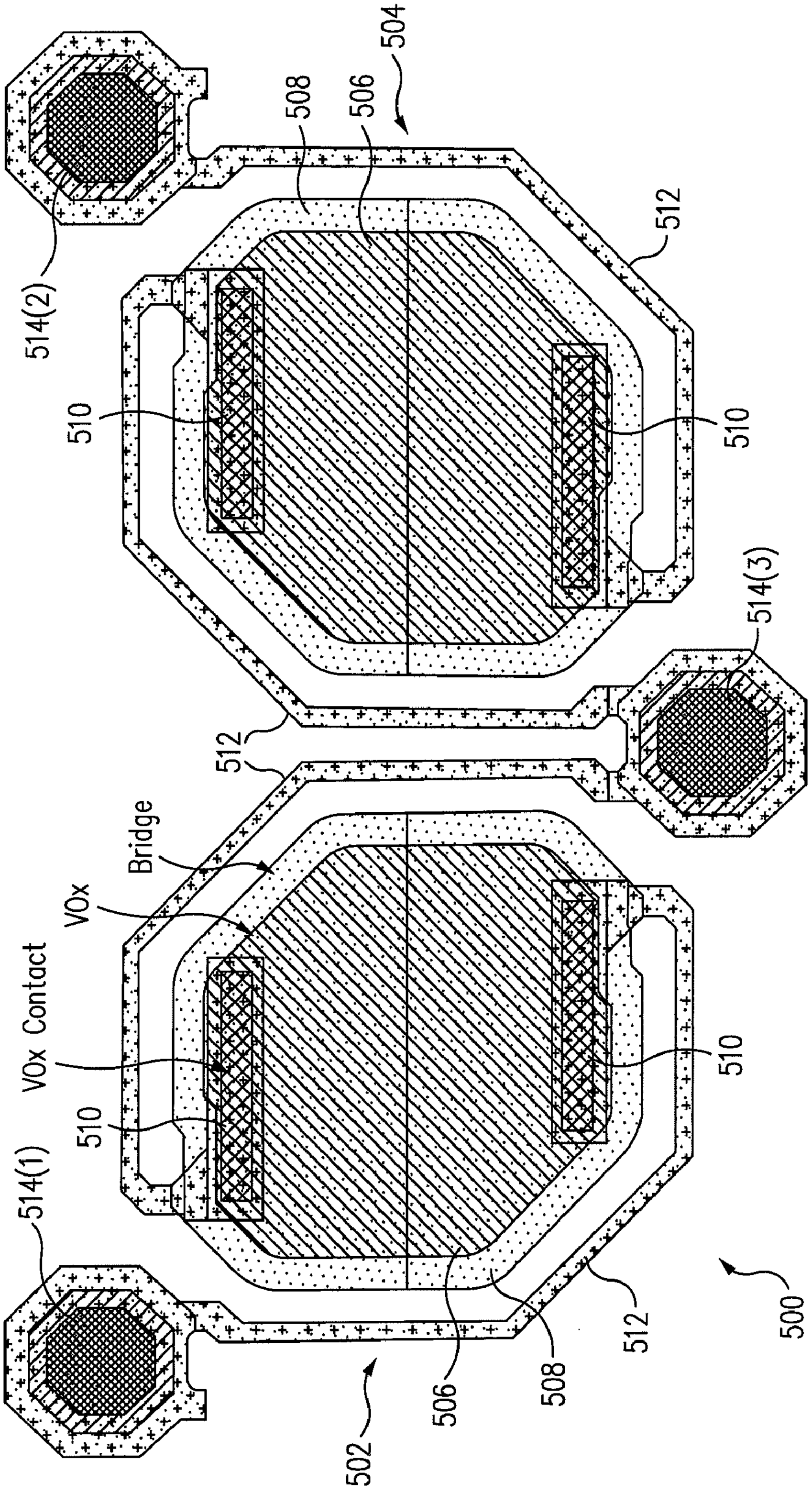
FIGS. 3-7 show physical layouts of microbolometer arrays in accordance with embodiments of the present invention.

FIG. 3 shows a physical layout of a microbolometer array 500 in accordance with an embodiment of the present invention. Microbolometer array 500 includes microbolometers 502 and 504, which are arranged as one column of two rows and may represent two of microbolometers 302 (e.g., microbolometers 302(1) and 302(2) in FIG. 1*a* or 1*b*) within circuit 300 or 330.

Microbolometers 502 and 504 each include a resistive material 506, which is formed of a high temperature coefficient of resistivity (TCR) material (e.g., vanadium oxide ($VO_X$) or amorphous silicon). Resistive material 506 is suspended on a bridge 508, with resistive material 506 coupled to its contacts 514 via legs 512. Legs 512 attach to resistive material 506 through a resistive material contact 510 (e.g., a leg metal to resistive metal contact and labeled $VO_X$ contact). In general, microbolometers 502 and 504 are constructed in a conventional manner with conventional materials, but share contact 514(3).

Figure 4:
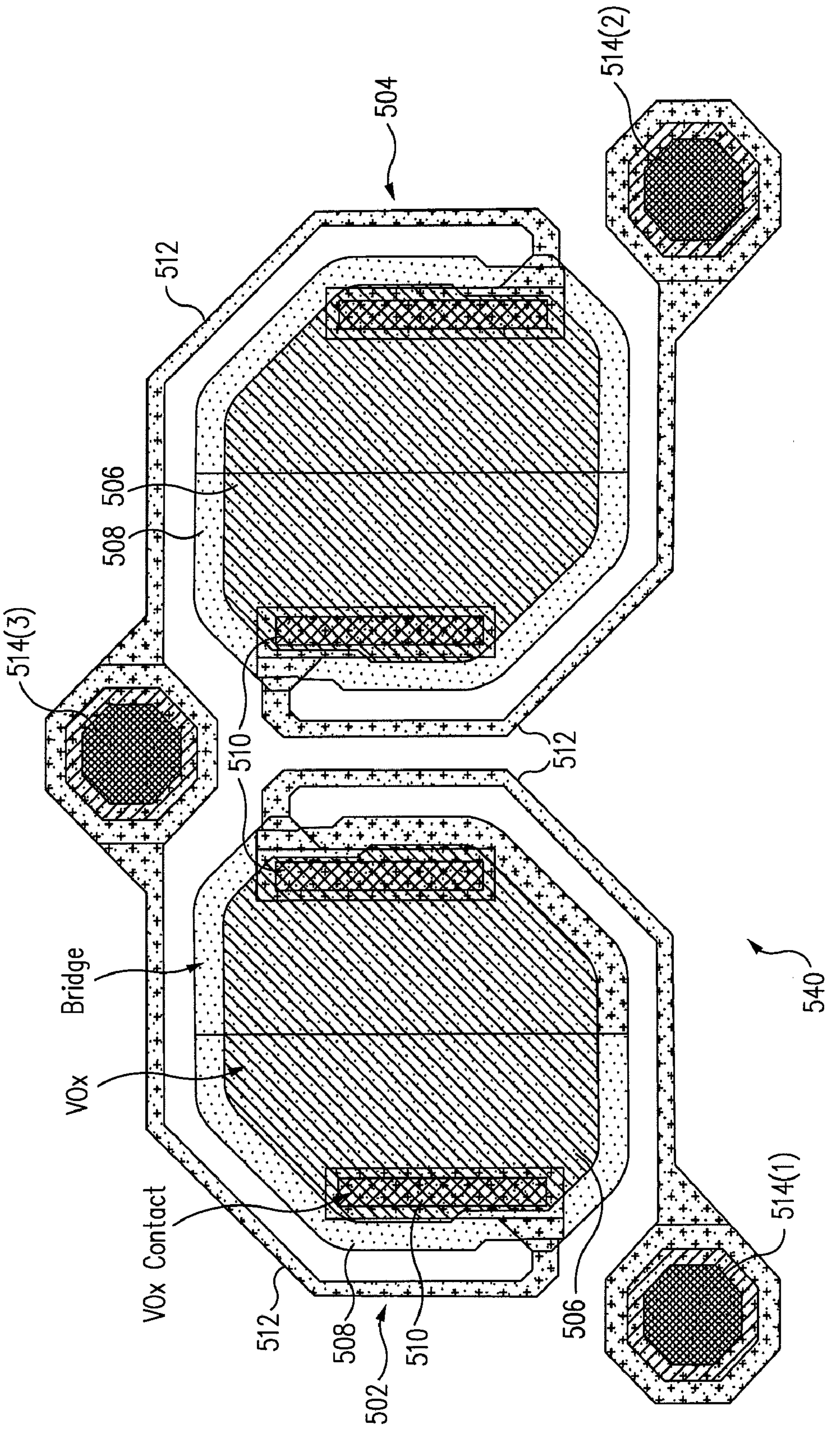

FIG. 4 shows a physical layout of a microbolometer array 540 in accordance with an embodiment of the present invention. Microbolometer array 540 is similar to microbolometer array 500 (FIG. 3), but contacts 514 are oriented in a different manner, as shown, relative to microbolometers 502 and 504. Microbolometer array 540 may allow a stronger bond between leg 512 and contact 514 and/or may be easier to form during the manufacturing process.

Figure 5:
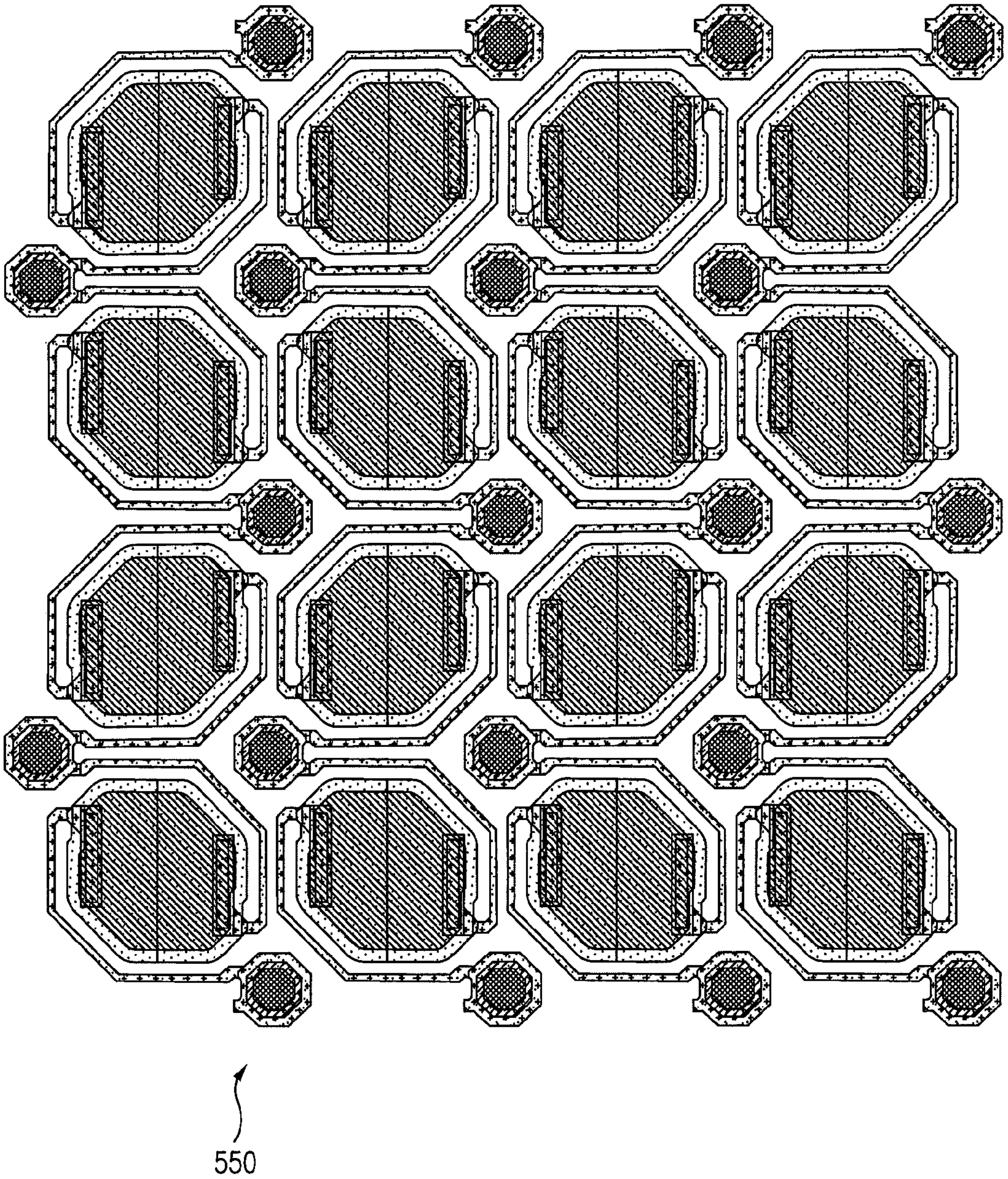

Microbolometer array 500 (FIG. 3) or microbolometer array 540 (FIG. 4) may be implemented as an array of any desired size (e.g., 644 by 512 pixels with each pixel (or microbolometer) 25 by 25 μm in size). For example, FIG. 5 shows a physical layout of a microbolometer array 550 in accordance with an embodiment of the present invention. Microbolometer array 550 is a four-by-four array having microbolometers implemented as described in reference to FIG. 3.

Figure 6:
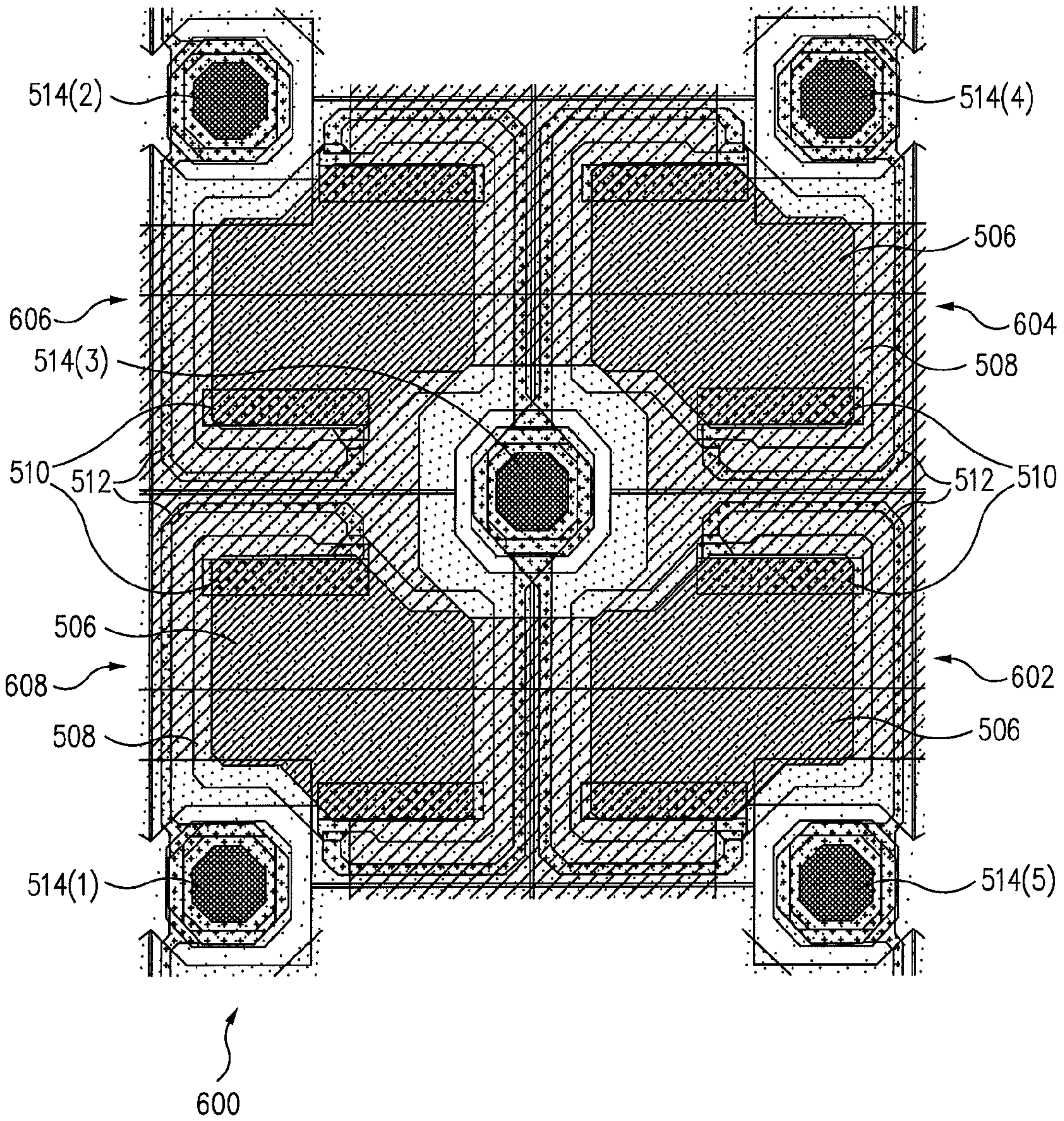

FIG. 6 shows a physical layout of a microbolometer array 600 in accordance with an embodiment of the present invention. Microbolometer array 600 includes microbolometers

602, 604, 606, and 608, which are arranged as two columns of two rows (e.g., microbolometers 602 and 604 forming one column and microbolometers 606 and 608 forming the other column).

Figure 7:
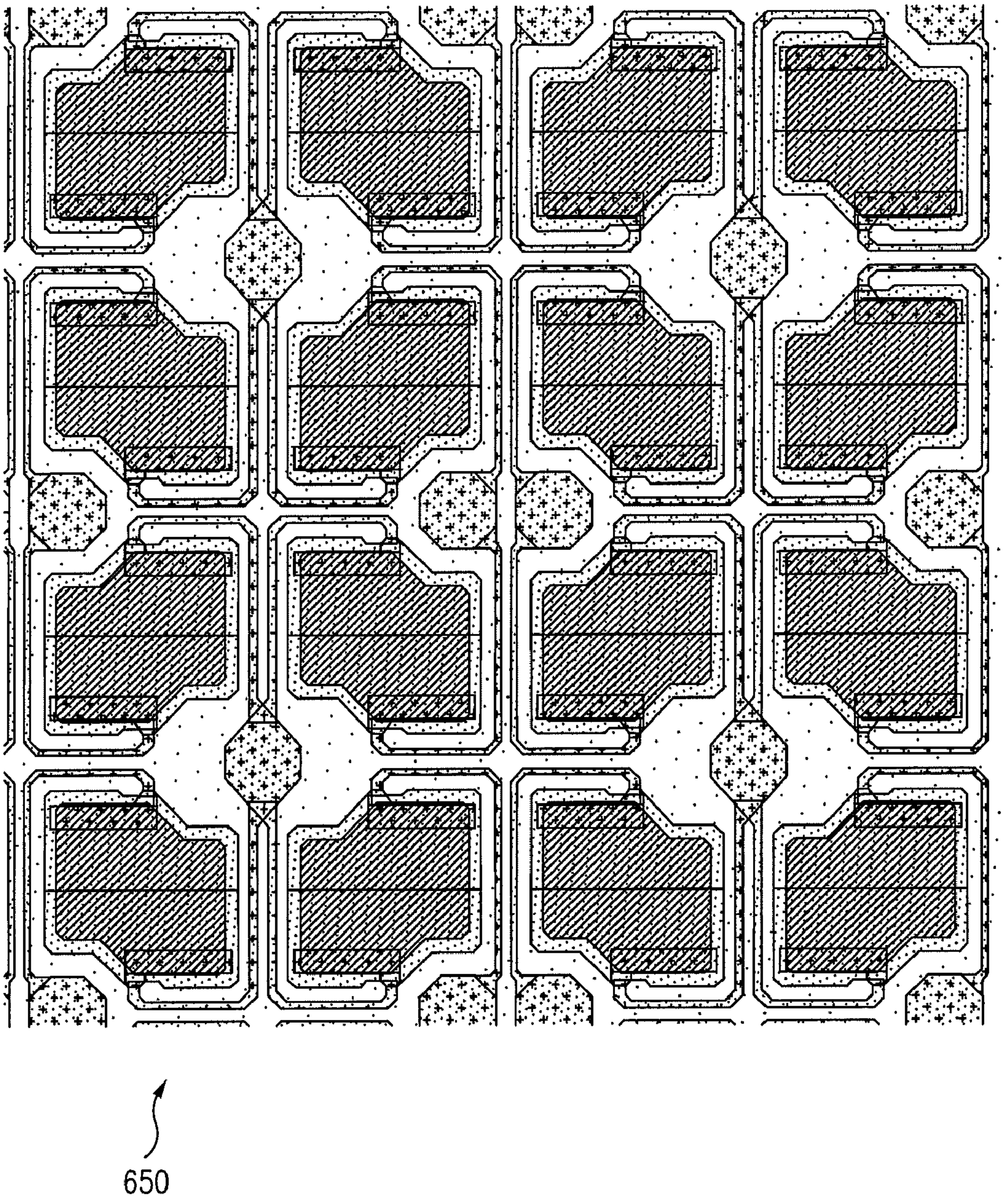

In general, microbolometers 602 through 608 are constructed in a manner similar to, for example, microbolometer 502(FIG. 3). However, microbolometers 602 through 608 are arranged to all share contact 514(3), shown centrally within FIG. 6. Thus, microbolometers 602 through 608 may represent, for example, four of microbolometers 302 (e.g., microbolometers 302(4), 302(5), 302(10), and 302(11) in FIG. 1*c*) of circuit 350. Furthermore, microbolometer array 600 may be replicated to implement an array of any desired size. For example, FIG. 7 shows a physical layout of a microbolometer array 650 in accordance with an embodiment of the present invention. Microbolometer array 650 is a four-by-four array having microbolometers implemented as described in reference to FIG. 6.

Figure 8:
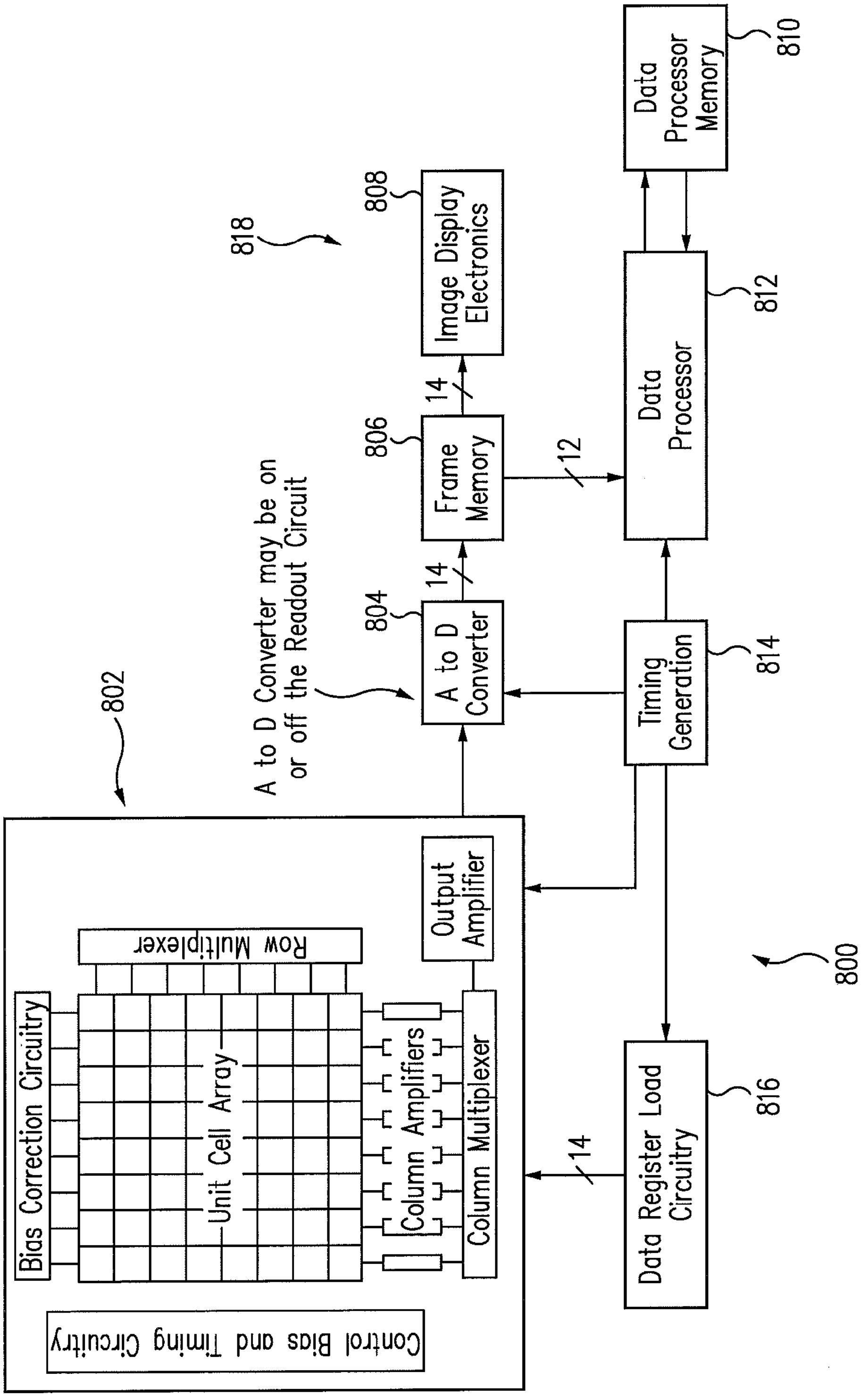
FIGS. 8 and 9 show block diagrams illustrating microbolometer focal plane arrays and associated circuitry in accordance with embodiments of the present invention.

FIG. 8 shows a block diagram 800 illustrating a microbolometer focal plane array 802, with uniformity-correction circuitry, and interface system electronics 818 in accordance with an embodiment of the present invention. Microbolometer focal plane array 802 includes a microbolometer array (labeled unit cell array) and a readout integrated circuit (ROIC) having control circuitry, timing circuitry, bias circuitry, row and column addressing circuitry, column amplifiers, and associated electronics to provide output signals that are digitized by an analog-to-digital (A/D) converter 804.

The microbolometer array (unit cell array) of microbolometer focal plane array 802 may be formed by microbolometers having shared contacts and selection switches as described in reference to FIGS. 1-7. The ROIC of microbolometer focal plane array 802 may be employed to control the selection switches (i.e., switches 304 and 332 as shown in FIGS. 1*a*, 1*b*, and/or 1*c* which may be formed as part of the ROIC) to select the desired microbolometers for obtaining the desired output signals. The column amplifiers and other circuitry of the ROIC may otherwise be constructed in a conventional manner.

The A/D converter 804 may be located on or off the ROIC. The output signals from A/D converter 804 are stored in a frame memory 806. The data in frame memory 806 is then available to image display electronics 808 and a data processor 812, which also has a data processor memory 810. A timing generator 814 provides system timing. It should be understood that the arrows within FIG. 8 are exemplary and may represent unidirectional or bidirectional communication, depending for example upon the specific application. For example, there may be bidirectional communication between frame memory 806 and data processor 812.

Data processor 812 generates uniformity-correction data words, which are loaded into a data register load circuitry 816 that provides the interface to load the correction data into the ROTC. In this fashion the digital-to-analog converters, and other variable circuitry, which control voltage levels, biasing, circuit element values, etc., are controlled by data processor 812 to provide the desired output signals from microbolometer focal plane array 802.

Figure 9:
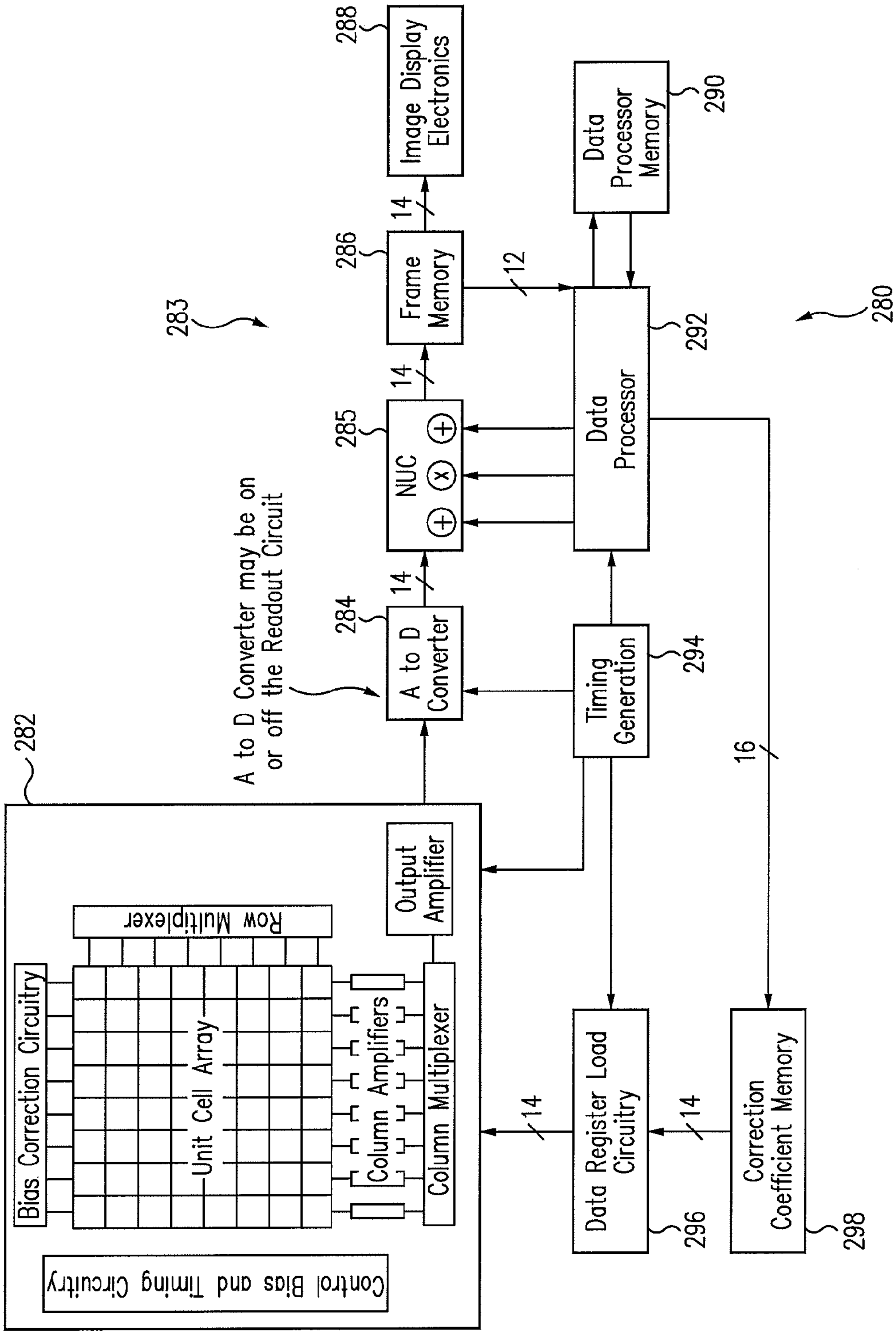

FIG. 9 shows a block diagram 280 illustrating a microbolometer focal plane array 282, with uniformity-correction circuitry, and interface system electronics 283 in accordance with an embodiment of the present invention. Block diagram 280 is similar to block diagram 800, but includes additional techniques for providing, for example, temperature compensation and/or correction for various non-uniformities, as described in further detail herein (e.g., in reference to FIGS. 10-17).

Microbolometer focal plane array 282 includes a microbolometer focal plane array (labeled unit cell array) and a readout integrated circuit (ROIC) having control circuitry, timing circuitry, bias circuitry, row and column addressing circuitry, column amplifiers, and associated electronics to provide output signals that are digitized by an analog-to-digital (A/D) converter 284.

The microbolometer array (unit cell array) of microbolometer focal plane array 282 may be formed by microbolometers having shared contacts and selection switches as described in reference to FIGS. 1-7. The ROIC of microbolometer focal plane array 282 may be employed to control the selection switches (i.e., switches 304 and 332 as shown in FIGS. 1*a*, 1*b*, and/or 1*c* which may be formed as part of the ROIC) to select the desired microbolometers for obtaining the desired output signals.

The A/D converter 284 may be located on or off the ROIC. The output signals from A/D converter 284 are adjusted by a non-uniformity correction circuit (NUC) 285, which applies temperature dependent compensation (e.g., Lagrange Offset, Temperature Dependent Gain, and additional Offset) as discussed herein, such as for example in reference to FIGS. 12-17. After processing by NUC 285, the output signals are stored in a frame memory 286. The data in frame memory 286 is then available to image display electronics 288 and a data processor 292, which also has a data processor memory 290. A timing generator 294 provides system timing.

It should be understood that the arrows within FIG. 9 (as discussed similarly in reference to FIG. 8) are exemplary and may represent unidirectional or bidirectional communication, depending for example upon the specific application. For example, there may be bidirectional communication between frame memory 806 and data processor 812. It should also be understood that the arrangement of the various functions within FIG. 9 (and FIG. 8) are exemplary and not limiting. For example as a specific implementation in accordance with an embodiment, frame memory 286 may be located between A/D converter 284 and NUC block 285, rather than between NUC block 285 and image display electronics 288 (as shown in FIG. 9 and as would be understood by one skilled in the art).

Data processor 292 generates uniformity-correction data words, which are loaded into a correction coefficient memory 298. A data register load circuitry 296 provides the interface to load the correction data into readout integrated circuit 282. In this fashion the variable resistors, digital-to-analog converters, and other variable circuitry, which control voltage levels, biasing, circuit element values, etc., may be controlled by data processor 292 so that the output signals from the readout integrated circuit are uniform over a wide temperature range.

Figure 10A:
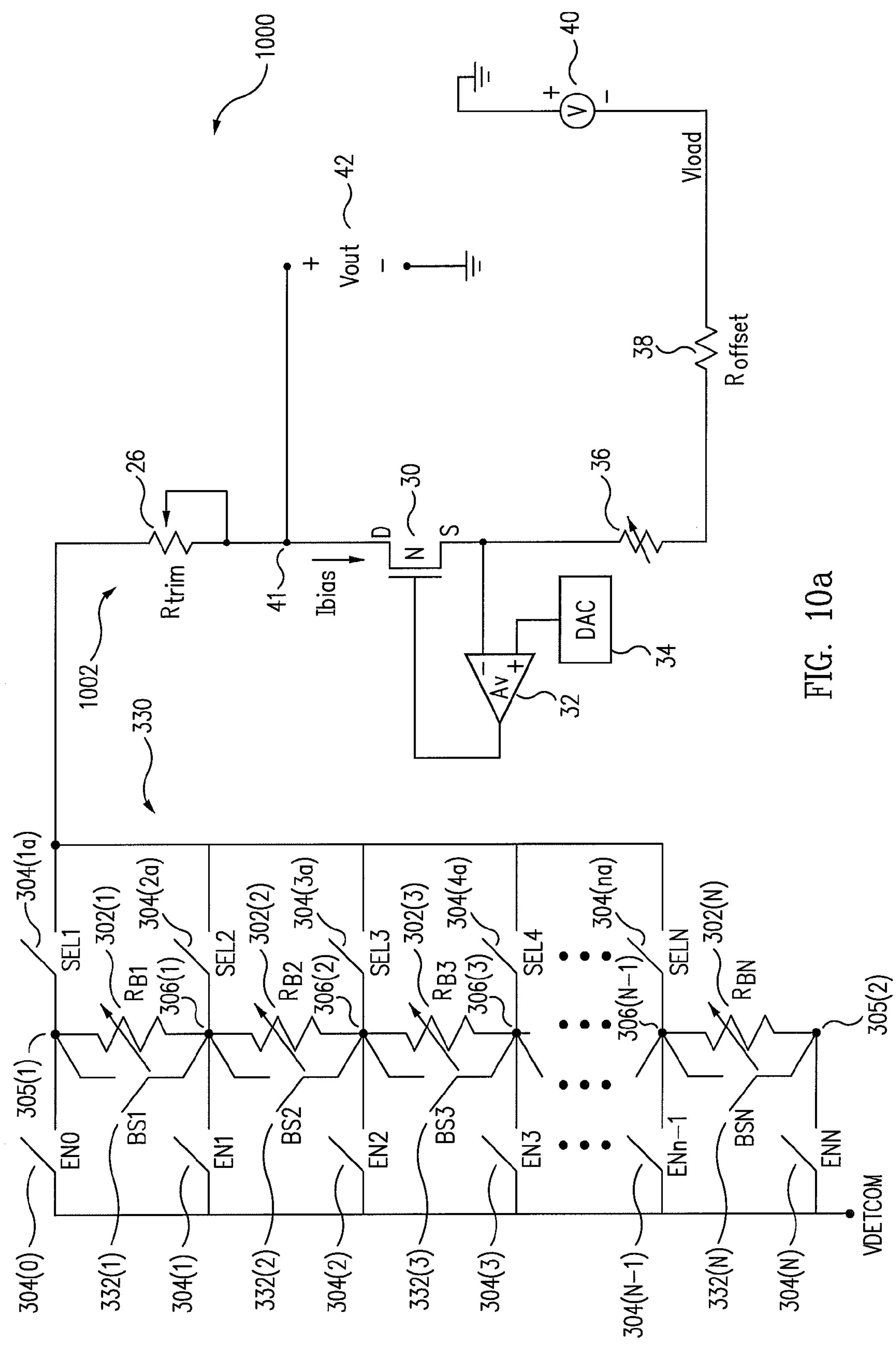
FIGS. 10*a*-10*c* and 11 show circuit diagrams illustrating a portion of a readout integrated circuit in accordance with embodiments of the present invention.
Figure 10B:
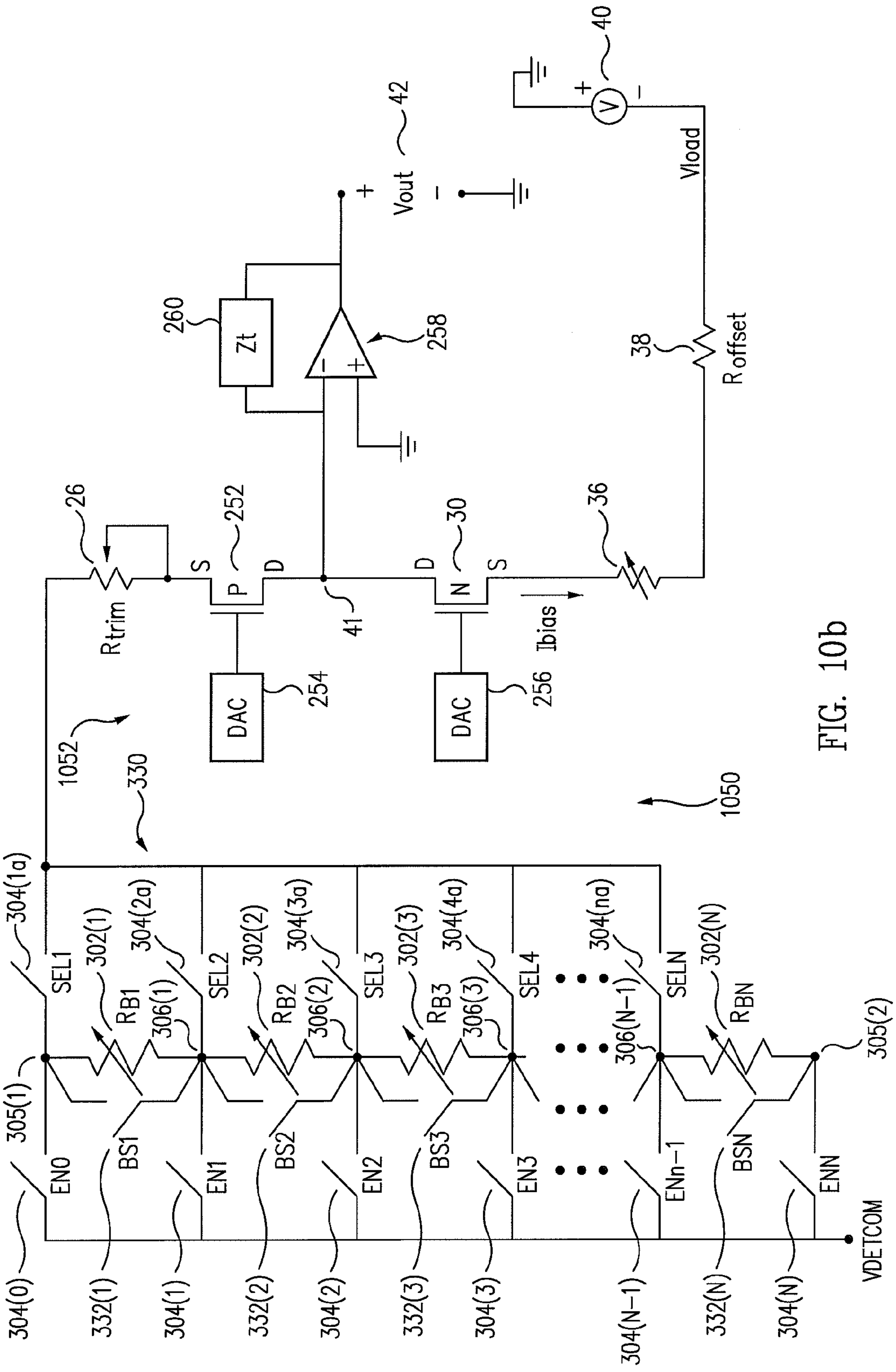

FIG. 10*a* shows a circuit 1000 illustrating a portion of a readout integrated circuit 1002 and circuit 330 (e.g., a portion of a microbolometer array, such as a row or a column) in accordance with an embodiment of the present invention. Circuit 1002 provides temperature compensation for circuit 330 in accordance with an embodiment of the present invention. It should be understood that circuit 330 is shown in an exemplary fashion and that circuit 300 (FIG. 1*a*) or circuit 350 (FIG. 1*c*) may be substituted for circuit 330 (e.g., in FIG. 10*a*, 10*b*, 10*c*, or 11), as would be understood by one skilled in the art.

Circuit 1002 includes supply voltage 40 (and may provide the reference voltage labeled VDETCOM), thermally-shorted microbolometer 36, resistors 26 and 38, transistor 30, amplifier 32, and a digital-to-analog converter (DAC) 34. As explained in detail herein, circuit 1002 provides substrate temperature compensation and temperature coefficient of resistance (TCR) mismatch compensation for the active and load microbolometers.

The active microbolometer is the thermally isolated microbolometer, selected from circuit 330 as explained above, which receives incident infrared radiation. The active microbolometer is biased by the reference voltage (VDETCOM) and a load current (Ibias). Amplifier 32 provides the gate bias for transistor 30 (an NMOS transistor), while DAC 34 is used to set an amplifier reference voltage and control amplifier 32 to set the appropriate gate bias for transistor 30. Alternatively, amplifier 32 can be eliminated and DAC 34 used to set the appropriate gate bias directly for transistor 30. A load circuit or bias circuit includes supply voltage 40, resistor 38, microbolometer 36 (thermally shorted (to the substrate) load microbolometer), transistor 30, and amplifier 32 with DAC 34, which are used to establish the load current (Ibias).

Microbolometer 36 is used as a substrate temperature compensated load. Supply voltage 40 is set to optimize the operating point for circuit 1002 by setting the nominal voltage drop across microbolometer 36. An output voltage (Vout) 42 of circuit 1002 is provided at a node 41.

Figure 11:
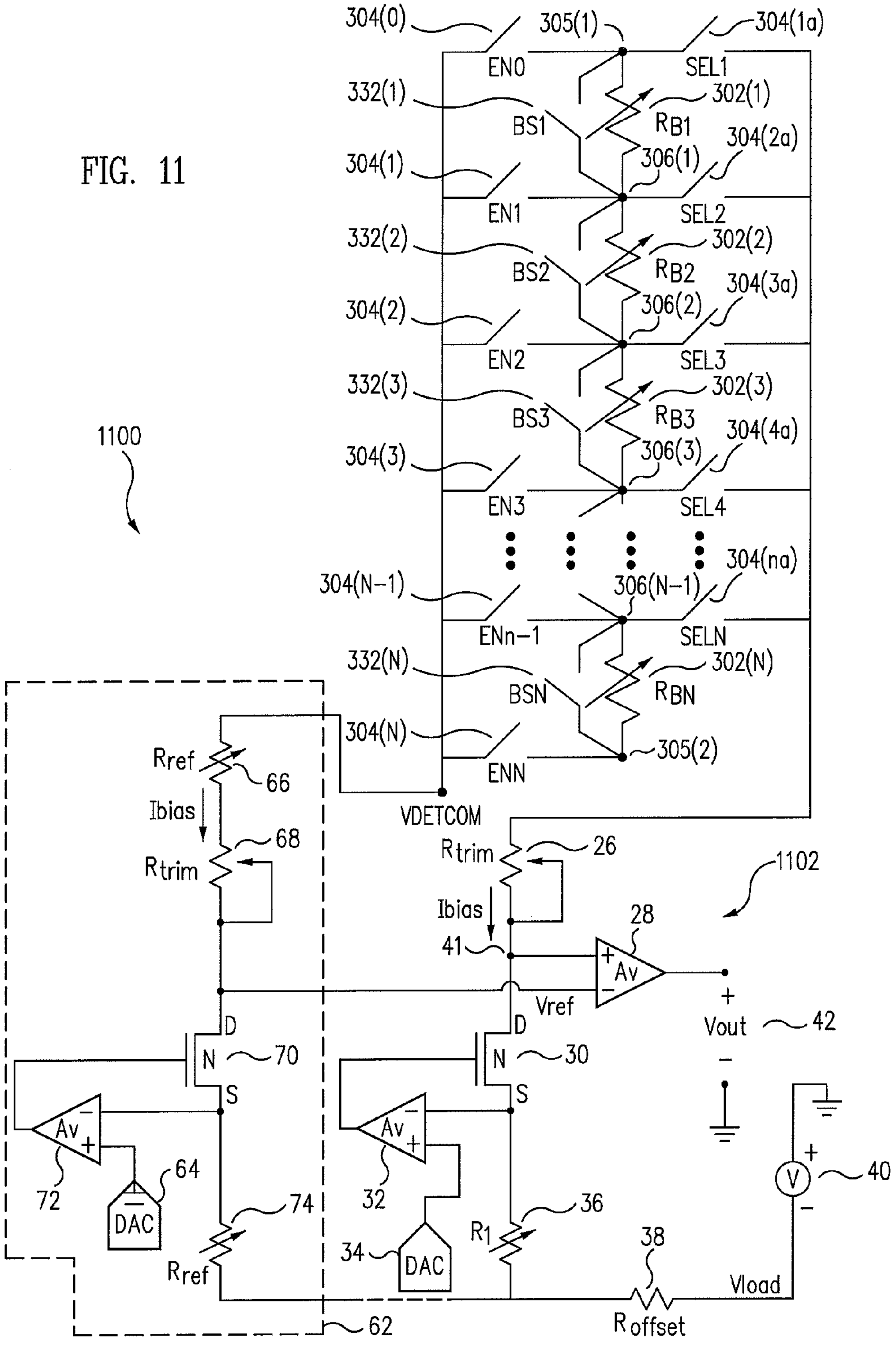

An amplifier (such as an amplifier 28 as illustrated in FIG. 11) may amplify a voltage at node 41 to provide an output voltage (Vout) 42. The amplifier is an exemplary circuit element to provide amplification or buffering for the voltage at node 41, if desired. As with amplifier 32, a DAC may provide a reference voltage (Vref) for the amplifier or the reference voltage may be at a set voltage level (e.g., ground). It should be apparent that output voltage (Vout) 42 may be translated, amplified, or converted by amplification or integration processes and/or other well known signal processing techniques.

For example, a transimpedance amplifier 258 (as illustrated in circuit 1050 of FIG. 10*b*) may be employed within a portion of a readout integrated circuit 1052 to provide the output voltage 42. In addition, a DAC 256 may control the gate terminal of transistor 30, while a DAC 254 controls a gate terminal of a transistor 252 coupled to resistor 26. Thus, transistor 252 along with transistor 30 may control the bias applied to the active microbolometer (selected from circuit 330) and microbolometer 36, respectively. Specifically, DAC 254 adjusts the offset by controlling the bias applied to the active microbolometer in combination with resistor 26 via transistor 252. Likewise, DAC 256 adjusts the offset by controlling the bias applied to microbolometer 36 in series with resistor 38 via transistor 30.

Transimpedance amplifier 258, having an impedance element 260 (e.g., a capacitor, a switched capacitor network, or a thermally-shorted microbolometer that may compensate gain as a function of substrate temperature), translates the current level flowing into transimpedance amplifier 258 into a voltage level at output voltage (Vout) 42. Consequently, DACs 254 and 256 determine the amount of current flowing through respective microbolometers (i.e., the active microbolometer and microbolometer 36) and also into transimpedance amplifier 258 and, thus, set the offset and reference level of output voltage (Vout) 42. DACs 254 and 256 can be calibrated, as discussed herein, for a single temperature or over a desired operating temperature range for each microbolometer in the FPA array.

In terms of general circuit operation for circuit 1000 (FIG. 10*a*), as incident infrared radiation levels increase, the temperature of the active microbolometer (i.e., one of microbolometers 302(1) through 302(N)) increases, which lowers its resistance and reduces the voltage drop across it and thus, increases the voltage level at the drain terminal of transistor 30 (i.e., node 41). In general, the change in the voltage drop across the active microbolometer causes a change in output voltage (Vout) 42. Therefore, as incident infrared radiation levels increase or decrease, this is reflected by the voltage level of output voltage (Vout) 42 increasing or decreasing, respectively.

In general, supply voltage 40 is used to adjust the load current and thereby optimize the operating point of the circuit by setting output voltage 42 at a desired point within a range of output circuitry voltage levels. Specifically, by setting the appropriate gate bias of transistor 30 and appropriate voltage level of supply voltage 40, the output voltage (Vout) 42 is adjusted.

For example, supply voltage 40 may be a single voltage level set for the entire array of microbolometers. Amplifier 32 and DAC 34 are then used to supply a unique voltage bias to each corresponding thermally-shorted microbolometer 36 in the FPA to provide a fine adjustment or offset to the load voltage or the load current (Ibias). This corrects for the individual offset errors in the output signals from each of the thermally-isolated microbolometers (e.g., the active microbolometers). By adjusting the offset for each microbolometer circuit, the nominal output voltage level of output voltage (Vout) 42 for each circuit is adjusted to fall within a desired range.

To address the relative mismatch in temperature coefficient of resistance (TCR) between the active microbolometer (in circuit 330) and microbolometer 36 (the load microbolometer), resistors 26 and 38 are provided. Resistor 26 is a variable resistor to generally provide fine adjustments to the composite TCR value of the active microbolometer portion of the circuit relative to the load microbolometer portion of the circuit. Thus, for the voltage divider network of resistors, resistor 26 adjusts the composite TCR of the active microbolometer and resistor 26 relative to microbolometer 36 and resistor 38. As an example, circuit values for these circuit elements are 100 KΩ and 300 KΩ for the active microbolometer and microbolometer 36, respectively, but these values are not limiting and may vary over a large range, such as for example 50-200 KΩ and 150-600 KΩ, respectively. Exemplary circuit values for resistors 26 and 38 may, for example, vary within 0-10 KΩ and 0-30 KΩ, respectively, but this range is not limiting and may vary over a wider range of values.

Resistors 26 and resistors 38 are typically resistors having a different TCR (generally lower) than their corresponding microbolometers (i.e., the active microbolometer and microbolometer 36). For example, resistor 26 may have a low TCR and the active microbolometer may have a higher TCR relative to microbolometer 36. Consequently, by the proper selection of resistance value for resistor 26, the combination of resistor 26 and the active microbolometer provides a TCR that is much closer to the TCR of microbolometer 36 (or the TCR of the combination of microbolometer 36 and resistor 38 if resistor 38 is present) than is the TCR of solely the active microbolometer. Therefore, the performance and behavior of each microbolometer within the array is vastly improved over a range of substrate temperatures.

The following equation illustrates the combined or composite TCR for a microbolometer in series with a variable resistor (i.e., the active microbolometer and resistor 26) as a function of temperature.

$$TCR=(TCR_{Bo}R_B(T)/(R_B(T)+R_{Trim}))$$

TCR, $TCR_{Bo}$, $R_B(T)$, and $R_{Trim}$ represent the effective combined TCR (labeled TCR), the TCR of the microbolometer (labeled $TCR_{Bo}$), the resistance of the microbolometer at a given temperature (labeled $R_B(T)$), and the resistance value of the variable resistor (e.g., to a first order constant as a function of temperature and labeled $R_{Trim}$), respectively. This equation illustrates how the combined TCR is adjusted depending upon the resistance value of the variable resistor.

Resistor 38 provides the coarse adjustment for circuit 1000. Consequently by setting resistor 26, temperature compensation is provided for the mismatch in relative TCR between the active microbolometer and the load microbolometer. A calibration procedure as a function of the substrate temperature is performed to determine the appropriate value for resistors 26 and 38. Details of an exemplary calibration procedure are provided herein.

The relative mismatch in TCR is driven by various factors, such as pulse bias heating, non-uniformities among microbolometers, and relative contact resistance between the active microbolometer and the load microbolometer and the substrate. Ideally, by accounting for the relative mismatch in TCR and offset as a function of substrate temperature, the output voltage for a given microbolometer circuit will be well behaved. For example, for a certain level of received incident infrared radiation, the microbolometer circuit output voltage may fall within a small percentage (e.g., twenty percent) of the minimum and maximum dynamic range over the desired substrate temperature range (e.g., from 250 to 350° C.).

It should be understood that FIG. 10*a* is an exemplary circuit to illustrate the relative TCR mismatch and temperature compensation techniques and that numerous modifications and variations are possible in accordance with the principles of the present invention. For example, resistor 38 may not be necessary, depending upon the characteristics of the microbolometers within the array. Resistors 26 and 38 may be implemented as parallel resistance, rather than series, relative to respective microbolometers, or some combination of series and parallel resistance may be implemented. The circuit arrangement may also vary, such as by interchanging the positions of resistor 26 and resistor 38 or the positions of circuit 330 and microbolometer 36. Furthermore, circuit polarities may be inverted, such as for example by inverting power supplies and substituting p-channel for n-channel transistors or vice versa as would be known by one skilled in the art. Additionally, one or more techniques discussed or referenced herein may be combined or selectively implemented, depending upon the application or various other factors.

Figure 10C:
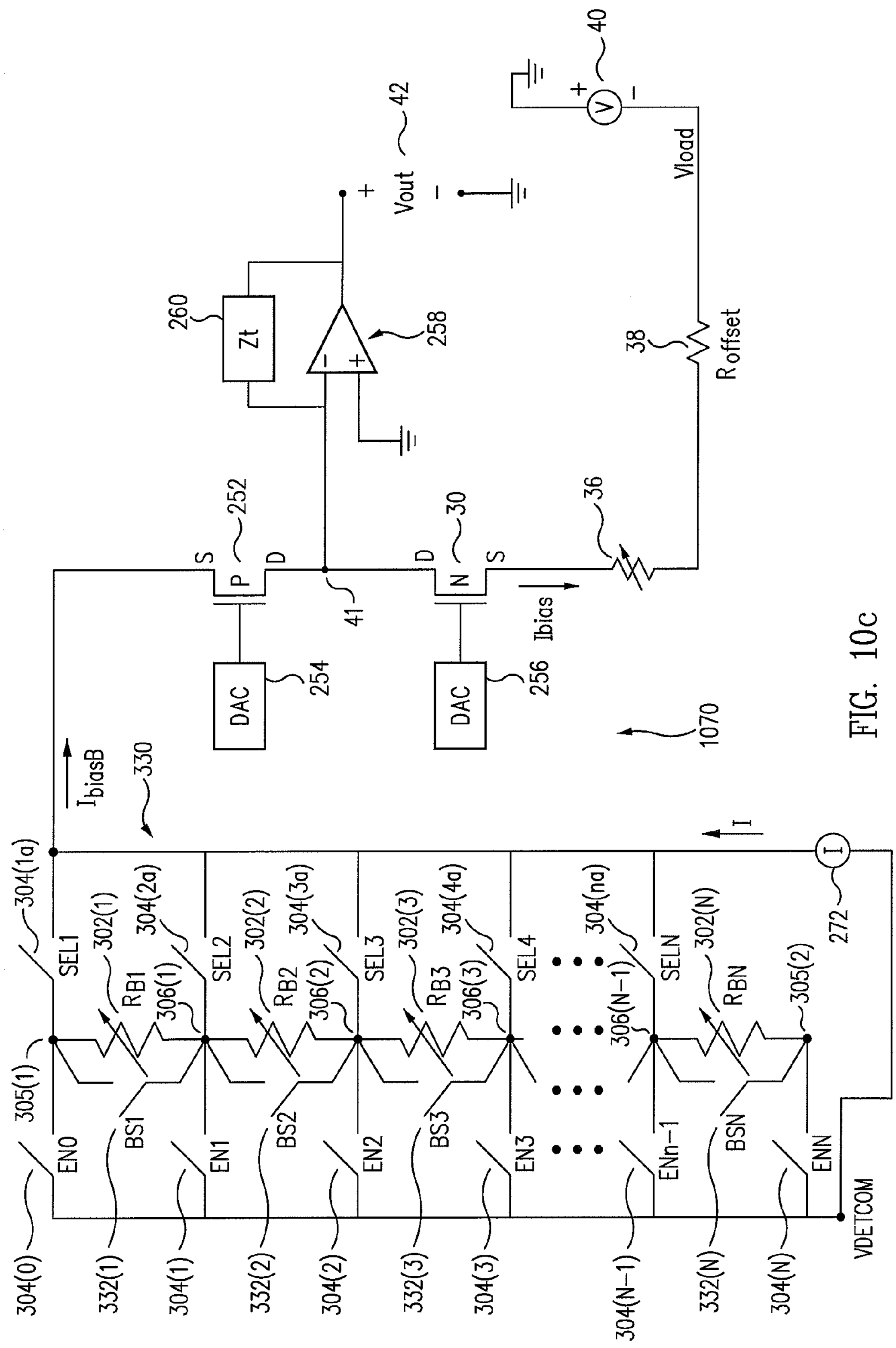

As an example of an alternative implementation, in accordance with an embodiment of the present invention, FIG. 10*c* shows a circuit 1070 illustrating a portion of a readout integrated circuit in accordance with an embodiment of the present invention. Circuit 1070 is similar to circuit 1050 of FIG. 10*b*, but resistor 26 is removed and a current source 272 is provided. The amount of current flowing through the active microbolometer (i.e., one of microbolometers 302(1) through 302(N)) to produce a microbolometer bias current (labeled IbiasB) is reduced by the contribution of current by current source 272. Therefore, the voltage across the active microbolometer is reduced and the change in the contribution of current through the active microbolometer to the microbolometer bias current (IbiasB) as a function of temperature is fractionally reduced. Thus, current source 272 has effectively lowered the temperature coefficient of resistance (TCR) of the active microbolometer.

Current source 272 may be employed to provide temperature compensation within the readout integrated circuit. Current source 272, for example, may be a fixed or a variable current source and may be varied or set in a similar fashion as discussed herein for resistor 26 (e.g., as discussed in reference to FIGS. 12-17) to provide temperature compensation.

In general as an example, circuit 1000 in FIG. 10*a* (as well as, for example, other circuits illustrated herein) can be implemented in an array configuration, with a portion of circuit 1000 placed in the unit cell while the remainder is placed outside of the unit cell, such as in the column amplifier. For example, circuit 330 may be solely placed within the unit cell array (along with associated selection circuitry, if desired, such as switches 304 and/or 332).

FIG. 11 shows a circuit 1100 illustrating a portion of a readout integrated circuit 1102 and circuit 330 (or a portion of a microbolometer array) in accordance with an embodiment of the present invention. Circuit 1102 provides temperature compensation for circuit 330 in accordance with an embodiment of the present invention.

Circuit 1100 is similar to circuit 1000 of FIG. 10*a*, but includes a reference path 62. Reference path 62 includes thermally shorted microbolometers 66 and 74, variable resistor 68, a transistor 70, an amplifier 72, and a DAC 64. DAC 64 provides a reference voltage to amplifier 72, which is used to appropriately bias transistor 70. DAC 64 and resistor 68 are adjusted to provide a reference voltage for amplifier 28. Amplifiers 32 and 72 may have their reference voltage provided by a DAC or the reference voltage may be provided to amplifier 32 and/or 72 by a set reference voltage level (e.g., ground). Furthermore, microbolometer 66 and/or microbolometer 74 may be replaced by a resistor, which would provide the necessary temperature dependent reference behavior.

Reference path 62 will be affected by changes in substrate temperature in a similar fashion as the remaining portions of circuit 1102. Consequently, the reference voltage to amplifier 28 will vary in temperature and, therefore, reference path 62 provides additional temperature compensation. Additionally, power supply noise from supply voltage 40 and the reference voltage (VDETCOM) are reduced by the common mode input to amplifier 28.

Figure 12:
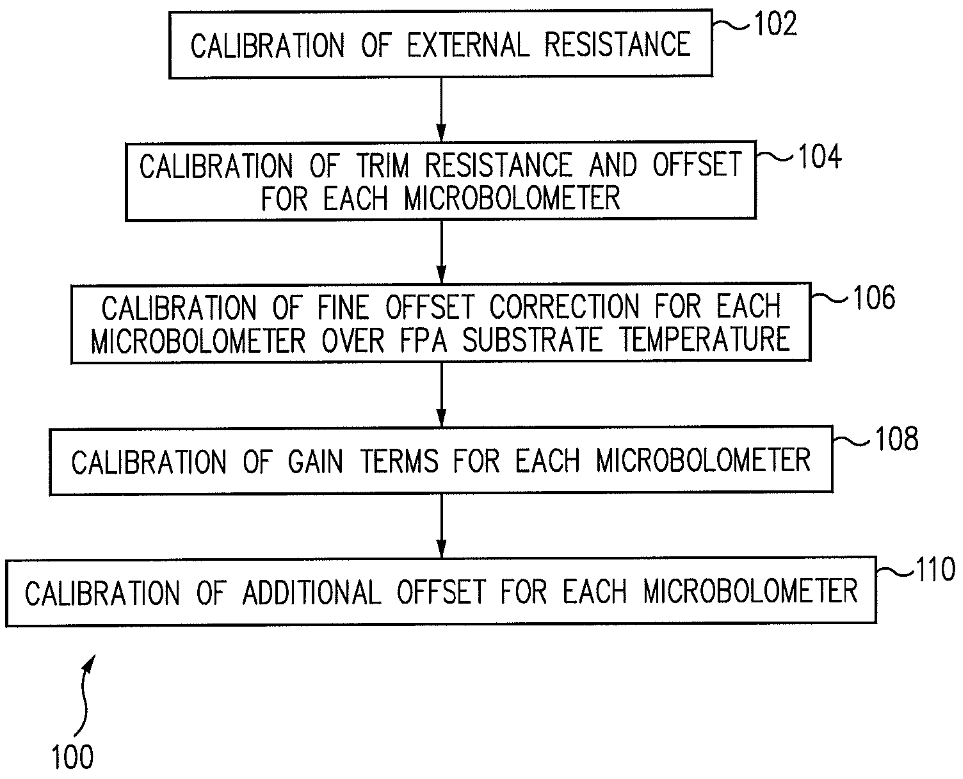
FIG. 12 shows a flowchart of a calibration process in accordance with an embodiment of the present invention.

FIG. 12 shows a top-level flowchart 100 of a calibration process in accordance with an embodiment of the present invention. Flowchart 100 includes steps 102 through 110 for calibrating a microbolometer FPA. Step 104 is a required step and steps 102 and 106 through 110 may be optional steps, depending upon the microbolometer FPA behavior or performance, the desired application, and required performance. FIGS. 13 through 16 provide exemplary detailed flowcharts pertaining to steps 102 through 110.

The external resistance is calibrated in step 102. The term "external resistance" refers, for example, to the resistance of a resistor such as resistor 38 of FIG. 10*a*, which is typically placed outside of the unit cell and is not part of the variable (or trim) resistance (e.g., resistor 26 of FIG. 10*a*). The external resistance or the value of the external resistor may be digitally selectable and/or may be a global resistor and may be on or off-chip (i.e., on or off the FPA or the ROIC). Therefore, one external variable resistor or a few external variable resistors may be sufficient for a large microbolometer FPA. For example, as each microbolometer in the array is sampled, the global external resistor is set to its calibrated value, determined during the calibration process, corresponding to that particular microbolometer, column, group, or array of microbolometers. As discussed above, depending upon the behavior of the microbolometers in the FPA, an external resistor may not be required.

The variable resistance and offset is calibrated for each microbolometer in step 104. The variable resistance or trim resistance refers, for example, to the resistance of a resistor (a trim resistor) such as resistor 26 in FIG. 10*a*. For example, step 104 determines the amount of resistance to be placed in series with each active microbolometer in the FPA. Step 104 also determines the amount of offset to be applied for each microbolometer in the FPA. As an example, the determined offset for each microbolometer may be set by using DAC 34 to control the gate bias of transistor 30 via amplifier 32 in FIG. 10*a*.

Step 106 provides fine offset correction calibration for each microbolometer circuit output over the desired substrate temperature range. Various techniques may be employed to provide a fine correction to each microbolometer circuit output after step 104 and possibly step 102 are performed, because these steps then provide a correctable microbolometer circuit output over a wide range of substrate temperature. The techniques may include various mathematical best-fit or offset correction algorithms or look-up table methods to determine the fine offset correction factor for a given temperature. For example, Lagrange terms enable a polynomial offset correction to be generated in real-time for each microbolometer that compensates for variations in microbolometer circuit output over FPA substrate temperature.

Step 108 provides gain calibration for each microbolometer. The gain terms normalize the response of each microbolometer to incident infrared radiation. This step may simply determine the gain term independent of FPA substrate temperature or, in a more general fashion, determine the gain term as a function of FPA substrate temperature. Similar mathematical best-fit, correction algorithms, or look-up table methods can be provided for these terms. Step 110 provides an additional fine offset, if required, for each microbolometer. The offset also may be a function of FPA substrate temperature.

Figure 13:
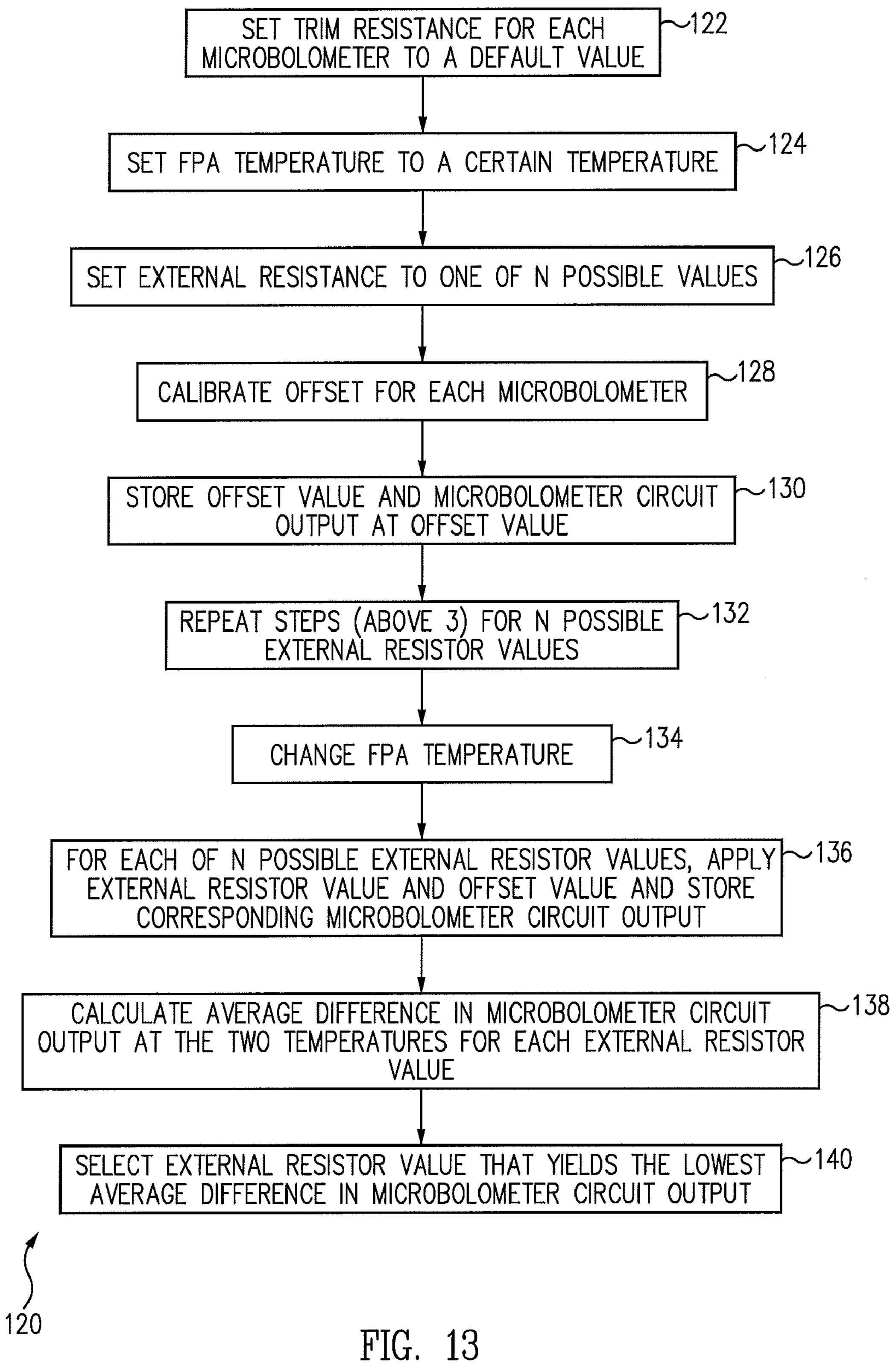
FIGS. 13-16 show detailed flowcharts for portions of the flowchart of FIG. 12 in accordance with embodiments of the present invention.

FIG. 13 is a detailed flowchart 120 for step 102 of flowchart 100 in FIG. 12. Flowchart 120 provides exemplary calibrations steps for calibrating the external resistor. Step 122 sets the trim resistor for each microbolometer to a target value, such as the median value of the trim resistor range. The FPA temperature is then set to a value (i.e., T1) within the desired calibration or operation temperature range (step 124). For example, T1 may represent the value of the minimum operating temperature range. The external resistor is then set to one of its "n" possible values (step 126) and the offset is calibrated for each microbolometer (step 128), where the offset may be calibrated using the procedure described below. The offset value and microbolometer circuit output value, obtained after application of the offset value, is stored (step 130) and steps 126 through step 128 are repeated for each of the n possible external resistor values (step 132). The result is n pairs of external resistor and offset values along with each corresponding microbolometer circuit output value.

The FPA temperature is then changed to another value (e.g., T2) within the desired calibration range (step 134). The stored external resistor and offset values are applied, for each value of n, and the microbolometer circuit output value is recorded (step 136). For each value of n, step 138 calculates the difference between the microbolometer circuit output from step 136 (i.e., at T1) and the microbolometer circuit output from step 132 (i.e., at T2) and then calculates the average difference across the full array of microbolometers. Step 140 selects the external resistor value corresponding to the smallest average difference obtained from step 138, with this resistor value being the calibrated value of the external resistor for the entire microbolometer FPA.

Figure 14:
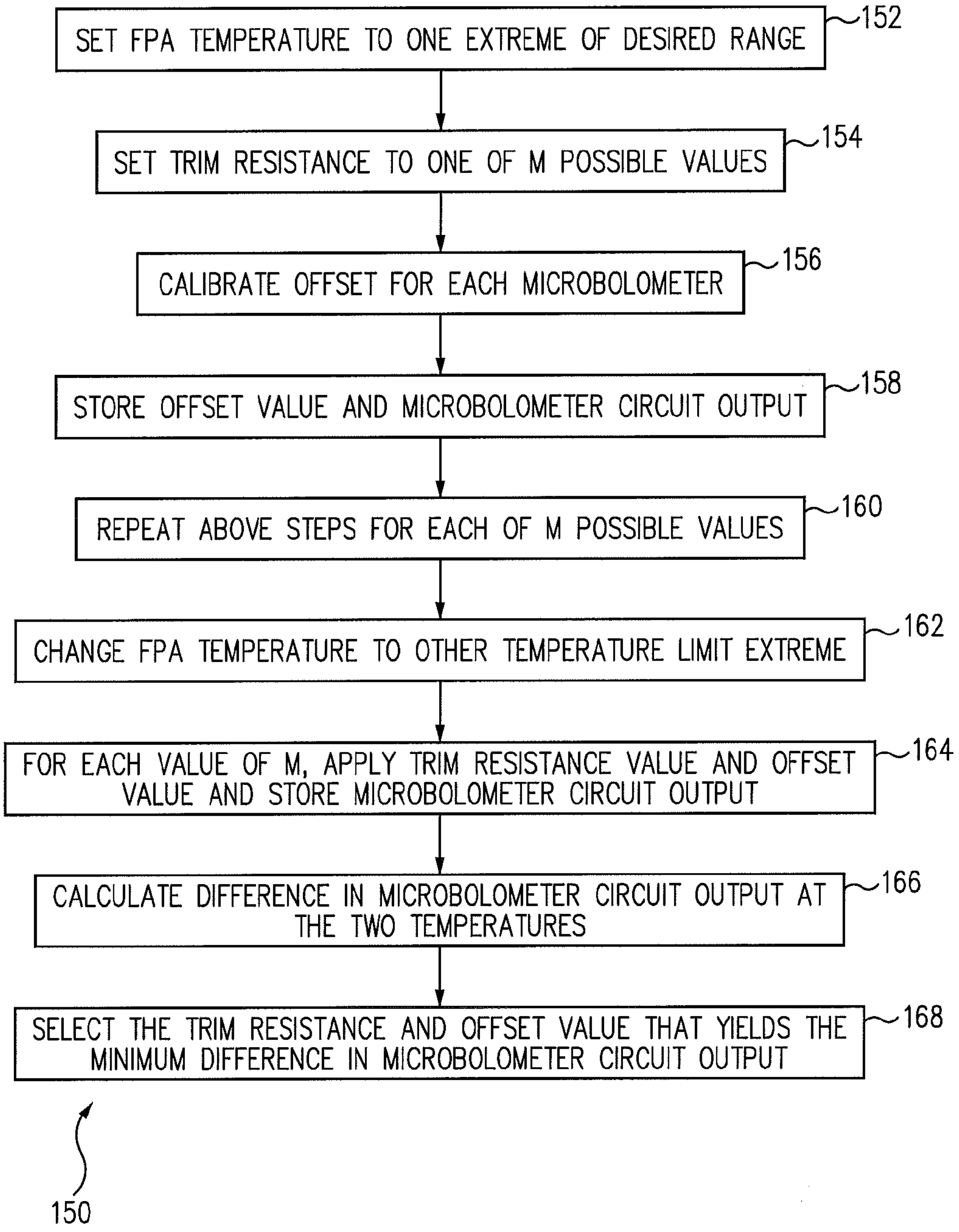

FIG. 14 is a detailed flowchart 150 for the trim resistance calibration in step 104 of flowchart 100 in FIG. 12. Flowchart 150 provides exemplary calibration steps for calibrating the trim resistor. Step 152 sets the FPA substrate temperature to one extreme of the desired operating or calibration temperature range (e.g., T1). The trim resistor is set to one of "m" possible values (step 154), such as the minimum value, and then the offset is calibrated (step 156) using a procedure, such as the one described below. The offset value and the resulting microbolometer circuit output value, after application of the offset value, are recorded for the given trim resistor value (step 158). Step 160 repeats steps 154 through 158 for each of the m possible trim resistor values, which results in m pairs of trim resistor/offset values and corresponding microbolometer circuit output values.

The FPA substrate temperature is then changed to a value (T2) at the opposite extreme as the prior value (T1) of the desired calibration or operating temperature range (step 162). For each value of m, the corresponding trim resistor value and offset value obtained in steps 154 through 160 are applied and the microbolometer circuit output value is recorded (step 164). For each value of m (FIG. 14-*step* 166), the difference is calculated between the microbolometer circuit output from step 164 (i.e., at temperature T2) and the microbolometer circuit output obtained from step 158 (i.e., at temperature T1). Step 168 selects the trim resistor value and associated offset value that corresponds to the minimum difference from the results of step 166.

These values are the calibrated values for the trim resistor and offset. Note that, if desired, the offset can be re-calibrated at a different FPA temperature value or with a different target value. This would provide a wider temperature operating range and more well-behaved performance.

For step 104 of flowchart 100 in FIG. 12, the offset value is determined for each microbolometer in the FPA. The offset value, for example, can be determined for each microbolometer by using a binary search to find the offset value that adjusts the microbolometer circuit output value closest to a desired value (i.e., microbolometer circuit output target value). The temperature of the FPA substrate and other parameters, such as the flux incident on the FPA, should generally not vary substantially while the offset calibration is in process.

Figure 15:
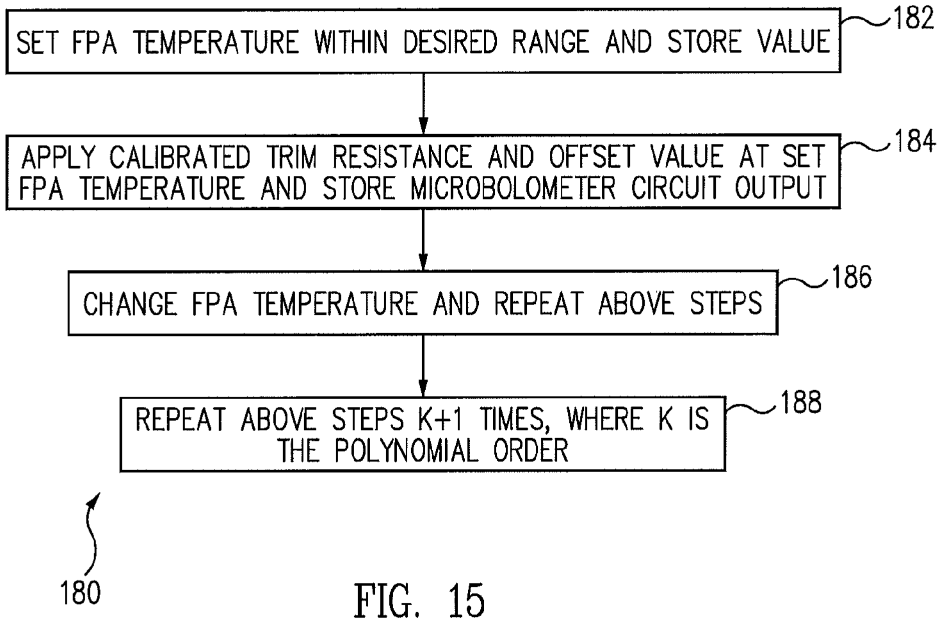

FIG. 15 is a detailed flowchart 180 for step 106 of flowchart 100 in FIG. 12. Flowchart 180 provides exemplary calibrations steps for calibrating the fine offset correction (e.g., Lagrange) terms for a microbolometer in the FPA array. However, the exemplary procedure could be employed in the more general case to calibrate many pixels simultaneously. Step 182 sets the FPA temperature to a value within the desired calibration or operating range and records the measured temperature value (having temperature units, such as Kelvin or Celsius, or units of volts that correspond to a given temperature). For this temperature, the microbolometer circuit output is recorded after the application of the calibrated trim resistor and offset values (step 184).

The FPA temperature is then changed, at step 186, to another value within the desired temperature range and steps 182 and 184 are repeated. Step 188 repeats step 186 a minimum of K+1 times, where K represents the desired order of the polynomial correction. For example, a minimum of four terms is stored if the third order polynomial correction is desired. The polynomial correction results generally improve if two of the K+1 points are at the opposite extremes of the desired calibration range.

The gain of each microbolometer can be calibrated using a two-point calibration process (e.g., at two different values of incident flux) at any arbitrary FPA temperature. Alternatively, the gain of each microbolometer can be calibrated as a function of FPA temperature, such as in the calibration process described below. Both procedures are similar to the fine offset (e.g., Lagrange) correction described above in reference to FIG. 15, but the two procedures (i.e., gain and fine offset) differ from each other in that instead of storing each microbolometer circuit output at a single value of incident flux, each microbolometer circuit output is stored for two values of incident flux.

Figure 16:
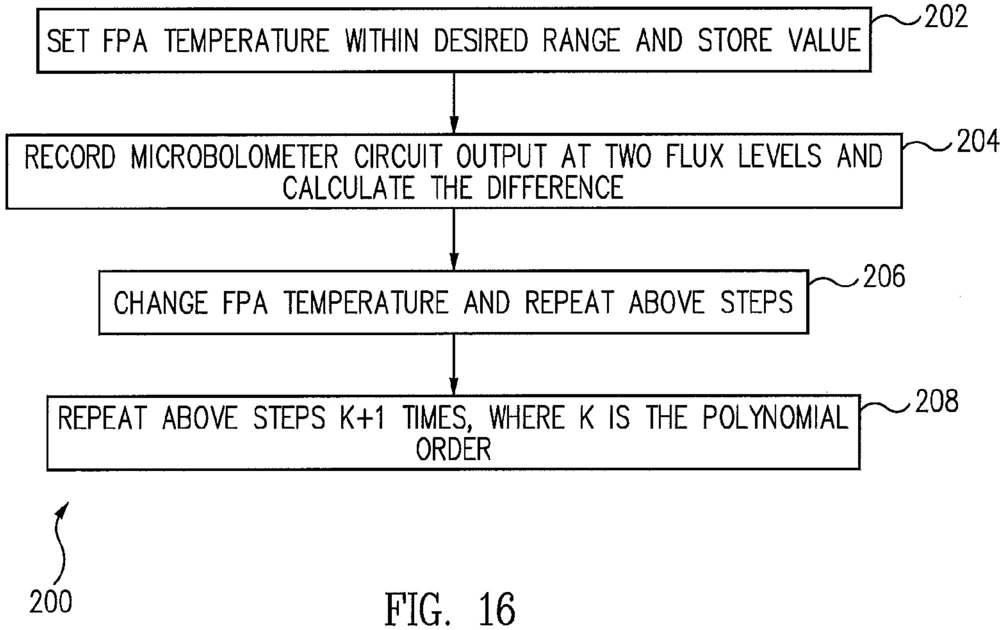

FIG. 16 is a detailed flowchart 200 for step 108 of flowchart 100 in FIG. 12. Flowchart 200 provides exemplary calibration steps for calibrating the gain of each microbolometer. Step 202 sets the FPA temperature to a value within the desired calibration or operating range and the temperature value is recorded (in units of temperature, such as Kelvin or Celsius, or in units of voltage that correspond to a given temperature). Step 204 records the microbolometer circuit output difference for two flux levels or responsivity for that temperature for each microbolometer. Step 206 changes the FPA temperature to another value within the calibration or operating range and the temperature value and each microbolometer circuit output is recorded.

Step 206 is repeated (in step 208) a minimum of K+1 times, where k represents the desired order of the polynomial fit of the gain terms.

Figure 17:
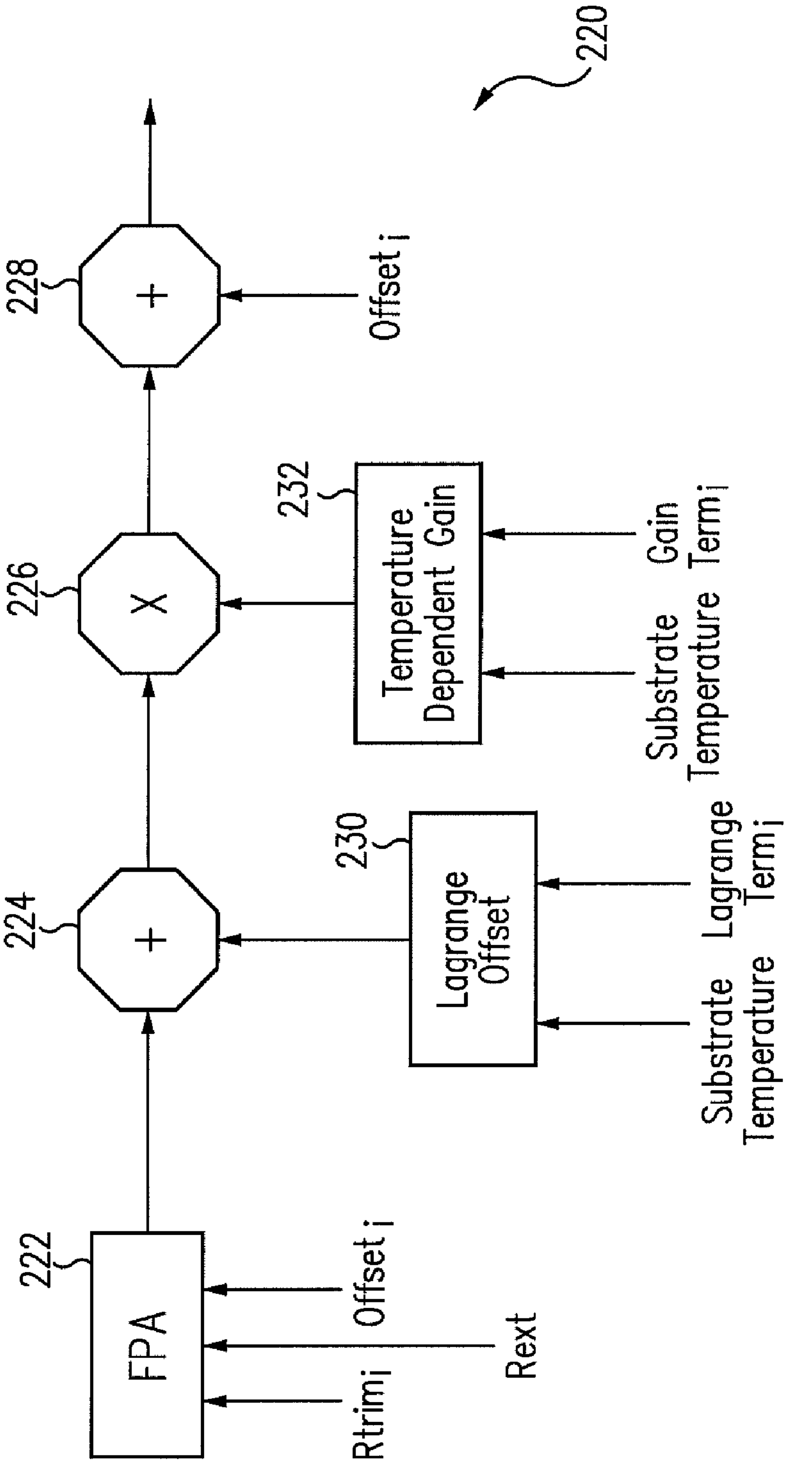
FIG. 17 shows a compensation process in accordance with an embodiment of the present invention.

FIG. 17 illustrates a compensation process 220 in accordance with an embodiment of the present invention. Compensation process 220 illustrates generally the overall compensation process for providing an optimal output from each microbolometer in the FPA over the desired FPA temperature range. The microbolometer FPA is represented symbolically by an FPA 222. As shown, each microbolometer in the array receives a trim resistor ($Rtrim_i$, where i ranges from $1 \leqq i \leqq$ maximum number of microbolometers in the array) and an offset calibration ($Offset_i$) adjustment. The trim resistor calibration and the offset calibration adjust each microbolometer circuit output over the calibrated temperature range. An external resistor (Rext) calibration is also optionally performed as described above, depending upon microbolometer FPA behavior. There may be an external resistor digitally selectable for each microbolometer or there may be one or more global external resistors that are calibrated for the entire microbolometer FPA or some corresponding portion of the microbolometer FPA.

The microbolometer circuit outputs from FPA 222 are combined in block 224 with the calibrated temperature-dependent fine (e.g., Lagrange) offset 230. The fine offset may be determined in any of a number of methods or techniques, as discussed herein. FIG. 17 refers to the fine offset as Lagrange offset 230, which is one exemplary method, but the fine offset is not intended to be limited solely to this exemplary method. Lagrange offset 230 provides the calibrated polynomial correction values for each microbolometer circuit output, which can be summed with each microbolometer circuit output from FPA 222.

The application of Lagrange offset 230 refines the microbolometer circuit output behavior and provides more uniform data at the data processor (i.e., reduces the curve or bow in microbolometer circuit output over temperature). Lagrange offset 230 receives as inputs the measured substrate temperature and the Lagrange terms ($Lagrange\ Term_i$), which are used to generate the Lagrange offset terms uniquely for each microbolometer in the array.

A block 226 receives the microbolometer circuit outputs, after application of the Lagrange offsets, and multiplies the microbolometer circuit outputs by a corresponding calibrated temperature dependent gain 232. The gain adjusts each microbolometer circuit output to provide a more uniform response to incident flux. As shown, the gain is temperature dependent and receives as inputs the measured substrate temperature and the gain terms (Gain Termi), which are used to generate the temperature dependent gain uniquely for each microbolometer in the array.

A block 228 receives the microbolometer circuit outputs, after application of the gain adjustment, and sums the microbolometer circuit outputs with additional offset terms (Offset), with the offset for block 228 typically differing from the offset input to FPA 222. For example, the offset term is updated periodically during camera operation using a shutter, a chopper, or a scene-based algorithm.

It should be appreciated that the implementation of the trim resistor (or current source 272) within each microbolometer circuit provides the correctable microbolometer FPA performance over a wide temperature range. The correctable microbolometer FPA performance over the calibrated temperature range then permits the application of Lagrange offset, gain, and offset calibration over the wide calibrated temperature range. It should also be appreciated that the principles of this invention may be implemented or applied to a wide variety of circuit devices and materials. Accordingly, the embodiments described herein are only exemplary of the principles of the invention and are not intended to limit the invention to the specific embodiments disclosed.

Embodiments described above illustrate but do not limit the invention. It should also be understood that numerous modifications and variations are possible in accordance with the principles of the present invention. Accordingly, the scope of the invention is defined only by the following claims.

We claim:

1. A circuit comprising:

a plurality of microbolometers forming a microbolometer array, wherein contacts within the microbolometer array are shared among the microbolometers;

means for selecting from among the microbolometers in the microbolometer array to apply a voltage and to receive a corresponding output signal from selected ones of the microbolometers; and means for selectively shorting one or more of the microbolometers in the microbolometer array which have not been selected by the selecting means.

2. The circuit of claim 1, wherein the means for selectively shorting is adapted to isolate the selected ones of the microbolometers by not shorting certain ones of the microbolometers relative to the selected ones of the microbolometers while shorting remaining ones of the microbolometers to reduce crosstalk within the microbolometer array.

3. The circuit of claim 1, wherein the contacts are shared between adjacent ones of the microbolometers in a column and the contacts are shared between the microbolometers in different columns in the microbolometer array.

4. The circuit of claim 1, wherein the means for selecting from among the microbolometers in the microbolometer array comprises a first set of switches adapted to apply the voltage to corresponding ones of the plurality of microbolometers and a second set of switches adapted to route the output signal from corresponding ones of the plurality of microbolometers.

5. The circuit of claim 4, wherein the means for selectively shorting one or more of the microbolometers in the microbolometer array comprises a third set of switches adapted to apply a short circuit across the microbolometers selectively which have not been selected by the selecting means.

6. The circuit of claim 4, wherein one of the first set of switches is closed for every two of the second set of switches that are closed to provide the output signals for two of the microbolometers in corresponding columns.

7. The circuit of claim 1, further comprising means for providing temperature compensation for the output signal.

8. The circuit of claim 7, wherein the means for providing temperature compensation comprises:

at least one resistor associated with the plurality of microbolometers, the at least one resistor adapted to be calibrated to provide temperature coefficient of resistance compensation for the microbolometers; and at least one bias circuit adapted to provide a bias for the plurality of microbolometers, wherein the bias circuit comprises a load microbolometer.

9. The circuit of claim 8, wherein the bias circuit further comprises a resistor adapted to provide temperature coefficient of resistance compensation for the load microbolometer, and wherein the means for providing temperature compensation further comprises at least one reference path associated with at least one of the plurality of microbolometers, the reference path adapted to provide a reference voltage, and wherein the circuit further comprises a data processor adapted to provide uniformity-correction data for the plurality of microbolometers and to control non-uniformity corrections of the output signals.

10. The circuit of claim 9, wherein the uniformity-correction data comprises trim resistance values and offset values for the plurality of microbolometers along with fine offset values and gain calibration values.

11. The circuit of claim 7, wherein the means for providing temperature compensation comprises:

at least one current source associated with the plurality of microbolometers;

at least one bias circuit adapted to provide a bias for the plurality of microbolometers; and a data processor adapted to provide uniformity-correction data for the plurality of microbolometers and to control non-uniformity corrections of the output signals.

12. A method of providing calibrated output signals from a microbolometer focal plane array having shared contacts, the method comprising:

selecting at least one row of the microbolometer focal plane array to apply a reference voltage and to provide corresponding output signals from microbolometers in the row; and selectively shorting one or more of the microbolometers in the microbolometer focal plane array that are not receiving the reference voltage and are not providing corresponding output signals.

13. The method of claim 12, wherein the selectively shorting the one or more microbolometers comprises forming a short circuit across the one or more microbolometers, and wherein the selectively shorting comprises isolating the microbolometers, selected by the selecting to provide output signals, by not shorting the microbolometers in one or more rows not selected by the selecting while shorting the microbolometers in one or more of the remaining rows not selected by the selecting.

14. The method of claim 12, further comprising:

providing a trim resistor value to provide temperature compensation for at least one of the microbolometers in the row; and providing an offset value to provide temperature compensation for at least one of the microbolometers in the row.

15. The method of claim 12, wherein the shared contacts are shared between adjacent microbolometers in columns of the microbolometer focal plane array.

16. The method of claim 12, wherein the shared contacts are shared between adjacent microbolometers in columns of the microbolometer focal plane array and between microbolometers in different columns of the microbolometer focal plane array.

17. The method of claim 12, wherein the selecting comprises:

applying the reference voltage to the microbolometers in the row; and providing a signal path from the microbolometers in the row.

18. The method of claim 12, wherein the selecting comprises:

applying the reference voltage to the microbolometers in the microbolometer focal plane array; and selecting sequentially each row of the microbolometer focal plane array to provide a signal path from the microbolometers in the row, wherein the reference voltage is removed from the previous row prior to selecting the next row through the shared contact.

19. The method of claim 12, further comprising providing temperature compensation for the microbolometer focal plane array to provide a temperature coefficient of resistance compensation value, a fine offset, and a gain calibration for the output signals.

20. A microbolometer focal plane array comprising:

a plurality of microbolometers forming a microbolometer array, wherein contacts within the microbolometer array are shared by the microbolometers;

a first plurality of switches adapted to provide a voltage to respective ones of the plurality of microbolometers;

a second plurality of switches adapted to receive an output signal from respective ones of the plurality of microbolometers; and a third plurality of switches adapted to selectively short respective ones of the plurality of microbolometers in the microbolometer array.

21. The microbolometer focal plane array of claim 20, wherein the first and second plurality of switches are initially asserted and de-asserted, respectively, and wherein during the read out of the microbolometers, one of the switches from the first plurality is deasserted prior to one of the switches from the second plurality being asserted which couple to the same contact, with this switching pattern repeated for the first and second plurality of switches.

22. The microbolometer focal plane claim 20, wherein the third plurality of switches are adapted to isolate the microbolometers, which receive the voltage via the respective first plurality of switches and provide their output signal via the respective second plurality of switches, by not shorting certain ones of the microbolometers relative to the isolated microbolometers while shorting remaining ones of the microbolometers in the microbolometer array.

23. The microbolometer focal plane array of claim 20, further comprising:

a resistor adapted to provide temperature compensation for at least one of the microbolometers; and a bias circuit, coupled to the resistor, adapted to provide an offset for at least one of the microbolometers.

24. The microbolometer focal plane array of claim 23, further comprising a reference path for at least one of the microbolometers, the reference path adapted to provide a temperature compensated reference voltage, and wherein the microbolometer focal plane array is couplable to a processor adapted to provide uniformity-correction data for the microbolometer focal plane array.

25. The microbolometer focal plane array of claim 24, wherein the uniformity correction data comprises at least one of a fine offset, a gain calibration, and an additional offset, and wherein the resistor and the bias circuit are adapted to be calibrated to provide temperature compensation for the microbolometers.

26. The microbolometer focal plane array of claim 20, further comprising:

a current source adapted to provide temperature compensation for at least one of the microbolometers; and a bias circuit, coupled to the current source, adapted to provide an offset for at least one of the microbolometers.

27. The microbolometer focal plane array of claim 26, wherein the microbolometer focal plane array is couplable to a processor adapted to provide uniformity-correction data for the microbolometer focal plane array.

* * * * *

UNITED STATES PATENT AND TRADEMARK OFFICE

CERTIFICATE OF CORRECTION

PATENT NO. : 7,679,048 B1
APPLICATION NO. : 12/105929
DATED : March 16, 2010

INVENTOR(S) : Naseem Y. Aziz and Robert F. Cannata

It is certified that error appears in the above-identified patent and that said Letters Patent is hereby corrected as shown below:

In column 9, line 54, change “ROTC” to --ROIC--.

In column 17, line 31, change “≦i≦” to --≤i≤--.

In column 18, line 2, change “Termi)” to --Term$_i$)--.

In column 18, line 8, change “(Offset),” to --(Offset$_i$),--.

Signed and Sealed this

First Day of June, 2010

David J. Kappos
*Director of the United States Patent and Trademark Office*